US012761124B2

(12) United States Patent
Binknerová et al.

(10) Patent No.: US 12,761,124 B2
(45) Date of Patent: Oct. 13, 2026

(54) MICROSCOPY SAMPLE PREPARATION METHODS AND ASSOCIATED SYSTEMS

(71) Applicant: FEI Company, Hillsboro, OR (US)

(72) Inventors: Petra Binknerová, Radešínská Svratka (CZ); Dennis Vymer, Světlá (CZ); David Prentice, Hillsboro, OR (US)

(73) Assignee: FEI Company

( * ) Notice: Subject to any disclaimer, the term of this patent is extended or adjusted under 35 U.S.C. 154(b) by 475 days.

(21) Appl. No.: 18/451,759

(22) Filed: Aug. 17, 2023

(65) Prior Publication Data

US 2025/0060289 A1 Feb. 20, 2025

(51) Int. Cl.

| | |
|---|---|
| ***G01N 1/28*** | (2006.01) |
| ***G06T 7/00*** | (2017.01) |
| ***H01J 37/20*** | (2006.01) |

(52) U.S. Cl.

CPC ......... *G01N 1/2813* (2013.01); *G06T 7/0002* (2013.01); *H01J 37/20* (2013.01); *G01N 2001/282* (2013.01); *H01J 2237/20214* (2013.01)

(58) Field of Classification Search

CPC .. G01N 1/2813; G01N 2001/282; G01N 1/06; G01N 1/286; G01N 23/00; G01N 23/20008; G01N 23/2202; G01N 2001/2873; G01N 23/2251; G01N 23/2204; G01N 2223/306; G01N 2223/401; G01N 2223/418; G06T 7/0002; H01J 37/20; H01J 2237/20214; H01J 2237/221; H01J 37/28

See application file for complete search history.

(56) References Cited

U.S. PATENT DOCUMENTS

| | | | | |
|---|---|---|---|---|
| 5,435,850 | A | 7/1995 | Rasmussen | |
| 5,851,413 | A | 12/1998 | Casella et al. | |
| 9,488,554 | B2 * | 11/2016 | Schmidt | G01N 1/286 |
| 9,653,260 | B2 * | 5/2017 | Keady | G01N 1/32 |
| 12,176,181 | B2 * | 12/2024 | Sun | G06N 3/08 |
| 2005/0285034 | A1 * | 12/2005 | Tanaka | H01J 37/28 250/307 |
| 2010/0282956 | A1 * | 11/2010 | Kimba | G01N 23/00 250/252.1 |
| 2013/0112893 | A1 * | 5/2013 | Miyake | H01J 37/28 250/306 |

(Continued)

*Primary Examiner* — David A Vanore
(74) *Attorney, Agent, or Firm* — Leron Vandsburger

(57) ABSTRACT

In an example, a method includes producing a set of projected sample characterization values associated with each of a plurality of processing axes and identifying a preferred processing axis based on the projected sample characterization values. In another representative example, a method includes extracting a sample specimen, producing a sample image of the sample specimen, identifying a preferred sample tilt angle, and rotating the sample specimen to an orientation corresponding to a preferred sample tilt angle. The method further includes processing the sample specimen to produce a lamella. In another representative example, a system includes a focused ion beam (FIB) system, a sample holder, a stage, and a controller operable to cause the stage to rotate the sample specimen relative to the ion beam axis such that the ion beam approaches the sample specimen along a preferred processing axis.

20 Claims, 14 Drawing Sheets

(56) References Cited

U.S. PATENT DOCUMENTS

| | | | | |
|---|---|---|---|---|
| 2013/0248707 | A1* | 9/2013 | Man | H01J 37/265 |
| | | | | 250/307 |
| 2020/0083017 | A1* | 3/2020 | Harada | G01N 21/956 |
| 2023/0093535 | A1* | 3/2023 | Karlík | G06T 7/11 |
| | | | | 250/492.3 |
| 2025/0060289 | A1* | 2/2025 | Binknerová | H01J 37/20 |
| 2025/0307492 | A1* | 10/2025 | Vymer | G06F 30/20 |

* cited by examiner

MICROSCOPY SAMPLE PREPARATION METHODS AND ASSOCIATED SYSTEMS

FIELD

The present disclosure relates generally to methods of preparing a sample for observation with a charged particle microscope, and more specifically to methods of preparing lamella with focused ion beam milling.

BACKGROUND

Charged particle microscopy is a well-known and increasingly important technique for imaging microscopic objects, particularly in the form of electron microscopy. The basic genus of the electron microscope finds practical application in the form of a variety of apparatus species, such as the Transmission Electron Microscope (TEM), Scanning Electron Microscope (SEM), and Scanning Transmission Electron Microscope (STEM), and also into various sub-species.

In a SEM, irradiation of a specimen by a scanning electron beam precipitates emanation of "auxiliary" radiation from the specimen in the form of secondary electrons, backscattered electrons, X-rays, and cathodoluminescence (infrared, visible and/or ultraviolet photons), for example. One or more components of this emanating radiation is/are then detected and used for image accumulation purposes.

As an alternative to the use of electrons as irradiating beam, charged particle microscopy can also be performed using other species of charged particle. In this respect, the phrase "charged particle" may be understood as encompassing electrons, positive ions (e.g., Ga or He ions), negative ions, protons, and positrons, for example. In addition to imaging and performing (localized) surface modification (e.g., milling, etching, deposition, etc.), a charged particle microscope also may have other functionalities, such as performing spectroscopy, examining diffractograms, etc.

In all cases, a charged particle microscope (CPM) generally will comprise at least a radiation source (e.g., an electron source or ion gun), a beam directing system, a specimen holder, and a detector.

The detector can take many different forms depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations. It generally is desirable that the detector exhibit a sufficiently broad dynamic range to represent a wide range of incident charged particle signal magnitudes.

While the present disclosure generally pertains to the specific context of charged particle microscopy, and more specifically to electron microscopy, such descriptions are not intended to be limiting, and it is within the scope of the present disclosure that the apparatuses and methods disclosed herein may be applied in any suitable context.

SUMMARY

Microscopy sample preparation methods and associated systems are disclosed herein.

In a representative example, a method includes producing, with a controller, a set of projected sample characterization values associated with each of a plurality of processing axes and identifying, with the controller, a preferred processing axis based on the projected sample characterization values.

In another representative example, a method includes extracting a sample specimen from a bulk sample positioned within a chamber of a charged particle microscope (CPM) system and imaging the sample specimen to produce a sample image representing a surface plane of the sample specimen. The method further includes producing a set of projected sample characterization values associated with each of a plurality of sample tilt angles, identifying a preferred sample tilt angle among the plurality of sample tilt angles, and rotating the sample specimen to an orientation corresponding to the sample tilt angle. Each projected sample characterization value represents features of the sample image projected along a processing axis corresponding to the sample tilt angle. The method further includes processing, with a focused ion beam (FIB) system of the CPM system, the sample specimen to produce a lamella.

In another representative example, a system includes a FIB system, a sample holder, a stage, and a controller. The FIB system is configured to direct and focus an ion beam toward a sample specimen along an ion beam axis. The sample holder is configured to support the sample specimen relative to the ion beam, and the stage is configured to rotate the sample specimen relative to the ion beam. The controller includes a processor system and a computer-readable medium storing processor-executable instructions that, when executed by the processor system, cause the processor system to produce a set of projected sample characterization values associated with each of a plurality of processing axes, identify a preferred processing axis based on the projected sample characterization values, and cause the stage to rotate the sample specimen relative to the ion beam axis such that the ion beam approaches the sample specimen along the preferred processing axis.

The foregoing and other objects, features, and advantages of the disclosed technology will become more apparent from the following detailed description, which proceeds with reference to the accompanying figures.

DETAILED DESCRIPTION

Figure 1:
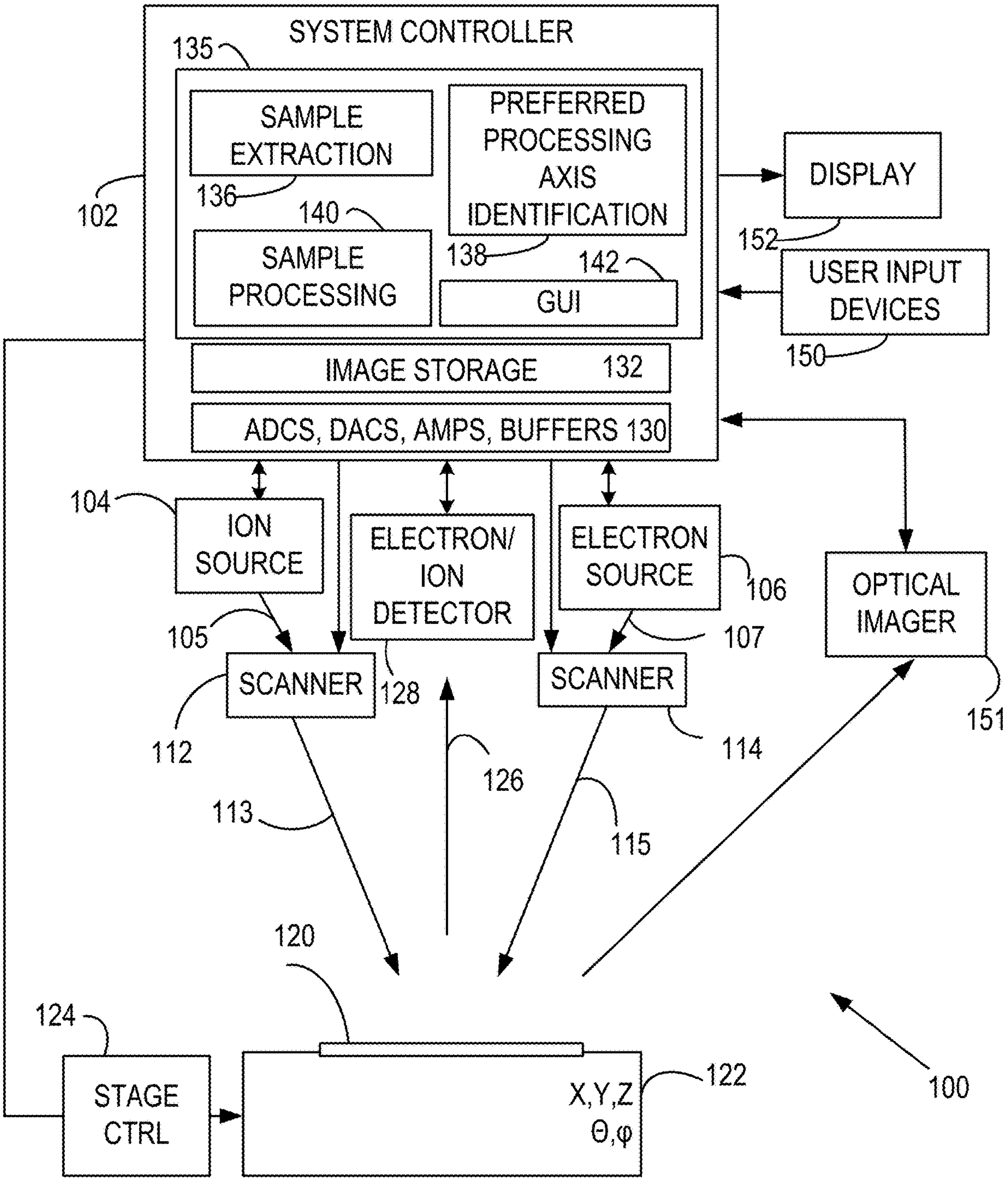
FIG. 1 is a schematic illustration of a charged particle microscope (CPM) system according to an example.

The present disclosure generally is directed to methods of preparing a sample, such as a lamella, for observation with a charged particle microscope (CPM) system. As discussed in more detail below, such methods can facilitate preparing such a sample in a manner that mitigates and/or minimizes artifacts such as curtaining that otherwise can diminish a uniformity of the sample. The example methods disclosed herein thus can result in preparing thin samples with a high degree of uniformity to facilitate subsequent analysis of the sample with a CPM system.

Many analytical techniques used to measure and/or characterize properties of a sample (e.g., a semiconductor sample) rely upon the sample being prepared in such a manner that the sample has a uniform thickness, and/or such that the sample is sufficiently thin to enable the use of analytical techniques such as transmission electron microscopy (TEM). Accordingly, in many cases, a sample of interest is prepared to meet such physical requirements prior to performing material analysis of the sample, such as by thinning the sample with a focused ion beam (FIB). In some cases, however, a sample may be non-uniform in composition and/or material properties in such a manner that FIB milling can yield undesirable structural artifacts.

As an example, a sample may include periodic features characterized by differing material properties (e.g., such as may be associated with a semiconductor heterostructure) that are removed at respectively differing rates by a FIB milling process. When the FIB milling is performed along an axis that intersects a series of similar features in the sample, the differences in milling rates can yield an artifact known as "curtaining," in which the milled sample includes elongate regions of significantly varying thickness. The methods disclosed herein may be employed to mitigate and/or at least substantially eliminate the incidence of such artifacts and/or non-uniformities, thus enabling the preparation of samples suitable for material analysis even when such samples are characterized by non-uniform material properties. Specifically, and as described in more detail below, the incidence of curtaining artifacts may be understood as being related to a processing axis of a FIB ion beam relative to the sample characterizing an orientation of the sample relative to the ion beam.

The present disclosure thus is directed to methods of identifying a preferred processing axis along which to process (e.g., mill) a sample with a FIB, such as by modeling the effects of milling the sample along a plurality and/or range of processing axes and identifying the preferred processing axis based upon this analysis. As described in more detail below, such analysis can be at least partially and/or completely automated, and can be performed such that the preferred processing axis is identified and the sample is milled accordingly without requiring human intervention and/or access to the sample.

Exemplary Systems

FIG. 1 depicts an example of a CPM system 100 that may be used in the performance of aspects of the methods disclosed herein and/or that may be used in conjunction with samples prepared according to the methods disclosed herein. The CPM system 100 includes a system controller 102 that is coupled to an ion beam source 104, that produces an ion beam 105 and an electron beam source 106 that produces an electron beam 107. Respective scanners 112, 114 are situated to direct a scanned ion beam 113 and a scanned electron beam 115, respectively, with respect to a specimen 120 (which additionally or alternatively may be referred to as a sample 120). In some examples, images are obtained based on the scanned electron beam 115, and the scanned ion beam 113 is used for specimen modification (e.g., prior to imaging the specimen 120 with the scanned electron beam 115). It is to be understood, however, that images can be obtained with either one or both of the scanned ion beam 113 and the scanned electron beam 115. In some examples, a CPM system includes only one of an electron beam source and an ion beam source. For example, for many biological specimens, only an electron beam is required.

The specimen 120 is secured to a stage 122 that is coupled to a stage controller 124 that is in turn coupled to the system controller 102. The stage 122 generally can provide one or more translations, rotations, or tilts as directed by the system controller 102. Responsive to the scanned ion beam 113 and/or the scanned electron beam 115, a beam 126 is directed from the specimen 120 to an electron or ion detector 128 which is coupled to system electronics 130. Such system electronics 130 can include one or more analog-to-digital convertors (ADCs), digital to analog-convertors (DACs), amplifiers, and/or buffers for control of the detector 128 and processing (e.g., amplification, digitization, and/or buffering) of signals associated with the detector 128. In other examples, a photon detector is used that produces an electrical signal that is further processed by the system electronics. In most practical examples, at least one ADC is used to produce a digitized detector signal that can be stored in one or more tangible computer readable media (shown as image storage 132) as an image. In other examples, image storage may be performed remotely via a communication connection such as a wired or wireless network connection. The beam 126 can include and/or be scattered portions of the scanned ion beam 113, the scanned electron beam 115, secondary electrons, ions, and/or neutral atoms. An optical imager 151 such as a camera can be coupled to the system controller 102 to produce an image of the specimen 120, such as to produce a substrate image that shows multiple substrate sections. Such images can be processed to identify, locate, and align each of the sections for further (typically higher resolution) imaging using a charged particle beam.

The system controller 102 is coupled to a memory 135 that stores processor-executable instructions for image processing and/or for performing any of the methods disclosed herein. As shown in FIG. 1, and as discussed in more detail below, such processor-executable instructions can be directed to processes such as sample extraction 136, preferred processing axis identification 138, and/or sample processing 140. The memory 135 also can provide a graphical user interface (GUI) 142 for various functions, including enabling a user to select sections of the specimen 120 to be processed and/or define a visible trace showing sections of interest. Images (e.g., CPM-generated images and/or optical images) can be stored in a memory portion 132. Stage coordinates (including rotations) can be stored in memory portion 132 as well. The system controller 102 establishes image acquisition parameters and is in communication with the stage controller 124. Specimen images (such as preview images, section images, substrate images, overview images) can be presented on a display 152, and system control and imaging parameters can be specified using internally stored values from the memory 135 or provided by a user with one or more user input devices 150. Further aspects and/or examples of the system controller 102 are disclosed herein with reference to FIG. 12.

It is to be understood that the layout of FIG. 1 is presented schematically for convenient illustration, and actual alignments of various beam sources, the optical camera 151, and the charged particle detector(s) are not shown. While a dual beam (ion/electron) system is illustrated, any suitable combination of ion and electron beams can be used, including systems that employ ion beams only or electron beams only. For example, in many practical examples such as electron microscopy, only an electron beam is used for imaging. As additional examples, various systems can include multiple FIB systems and/or multiple SEM systems.

Figure 2:
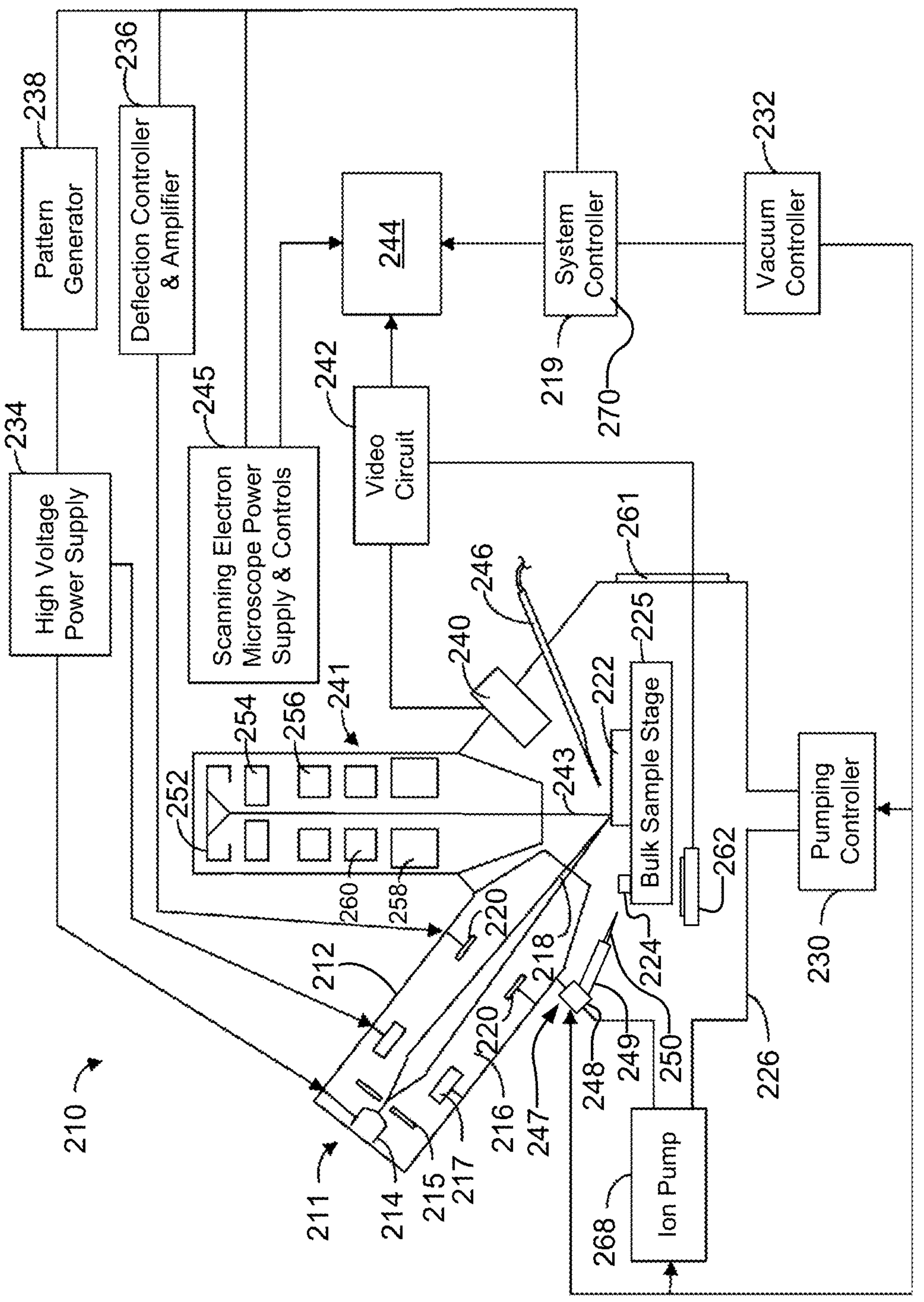
FIG. 2 is a schematic illustration of a CPM system according to another example.

FIG. 2 illustrates another example of a CPM system 210 that may be used in the performance of aspects of the methods disclosed herein and/or that may be used in conjunction with samples prepared according to the methods disclosed herein. In particular, FIG. 2 illustrates an example in which the CPM system 210 is a dual-beam CPM system 210 that includes scanning electron microscope (SEM) 241 and a focused ion beam (FIB) system 211. The SEM 241 includes a vertically mounted column, while the FIB system 211 includes a column that is mounted at an angle of approximately 52° from the vertical. While an example of suitable hardware is disclosed herein with reference to FIG. 2, it is to be understood that the methods of the present disclosure also may be performed in conjunction with any other suitable hardware.

The SEM 241 includes a cathode 252 configured to emit an electron beam 243 by applying a voltage between the cathode 252 and an anode 254. The electron beam 243 is focused to a spot on a sample 222 by a condensing lens 256 and an objective lens 258. The sample 222 can include and/or be any of a variety of materials, such as a semiconductor substrate. Accordingly, the sample 222 additionally or alternatively may be referred to as a substrate 222 and/or as a bulk sample 222.

The sample 222 may be positioned on and/or supported by a stage 225 (e.g., a translation stage) positioned within a lower chamber 226 of the CPM system 210. The stage 225 can preferably move in a horizontal plane (e.g., along X and Y axes) and vertically (e.g., along a Z axis). In some examples, the stage 225 can also tilt approximately 60° and rotate about the Z axis.

As shown in FIG. 2, the CPM system 210 additionally can include a sample holder 224 configured to support a sample specimen (e.g., a lamella) for investigation and/or characterization by the SEM 241 (e.g., while using the SEM 241 as a TEM, and/or while using the SEM 241 to perform scanning transmission electron microscopy (STEM)), and/or for processing the sample specimen for TEM analysis. For example, the sample holder 224 can be configured to support a sample specimen that is extracted and/or otherwise removed from the bulk sample 222 and that is to be inspected and/or analyzed by the SEM 241. The sample holder 224 can support the sample specimen while processing the sample (e.g., while thinning the sample with the FIB system 211) and/or while conducting analysis with the SEM 241. In the present disclosure, the sample holder 224 also may be referred to a TEM grid 224. The sample holder 224 may be supported by the stage 225 and/or may include at least a portion of the stage 225. For example, the sample holder 224 may be configured to translate and/or rotate the sample specimen.

The lower chamber 226 can include a door 261 via which the sample 222 may be positioned onto the stage 225. The door 261 also may allow for servicing an internal gas supply reservoir, if one is used. The door 261 may be interlocked so that it cannot be opened if the system is under vacuum. While FIG. 2 illustrates an example in which the sample stage 225 can operate as a translation stage, it also is within the scope of the present disclosure that the sample 222 can be supported by a motion stage (e.g., a translation and/or rotation stage) that is supported by the sample stage 225.

The focused electron beam 243 may be scanned in a two-dimensional pattern relative to the sample 222 by a deflection coil 260. Additionally or alternatively, the sample 222 may be moved relative to the electron beam 243 by the translation stage 225. The CPM system 210 can include a power supply and control unit 245 programmed and/or configured to control operation of the condensing lens 256, the objective lens 258, and the deflection coil 260. When the electrons in the electron beam 243 strike the sample 222, secondary electrons are emitted from the sample 222, which may be detected by a secondary electron detector 240 as discussed below. Additionally or alternatively, a STEM detector 262 may be positioned beneath the sample holder 224 and the stage 225 to collect electrons that are transmitted through the sample mounted on the sample holder 224.

The FIB system 211 includes an evacuated chamber having an upper neck portion 212 within which are located an ion source 214 (e.g., a liquid metal ion source) and a focusing column 216 including extractor electrodes and an electrostatic optical system. In the example of FIG. 2, the axis of focusing column 216 is tilted relative to the axis of the electron beam 243 of the SEM 241 by 52°. The upper neck portion 212 includes an ion source 214, an extraction electrode 215, a focusing element 217, and deflection elements 220. The ion source 214 is configured to emit an ion beam 218 that passes through the focusing column 216 and between electrostatic deflectors 220 toward the sample 222.

The CPM system 210 additionally includes an ion pump 268 for evacuating the upper neck portion 212. The lower chamber 226 may be evacuated with turbomolecular and mechanical pumping system 230 under the control of vacuum controller 232. The vacuum system provides within the lower chamber 226 a vacuum of between approximately $1\times10^{-7}$ Torr and $5\times10^{-4}$ Torr. If an etch-assisting gas, an etch-retarding gas, or a deposition precursor gas is used, the chamber background pressure may rise, typically to about $1\times10^{-5}$ Torr.

The CPM system 210 includes a high voltage power supply 234 that provides an appropriate acceleration voltage to electrodes in the ion beam focusing column 216 for energizing and focusing the ion beam 218. When the focused ion beam 218 strikes the sample 222, material may be physically ejected (e.g., sputtered) from the sample. Additionally or alternatively, the ion beam 218 can decompose a precursor gas to deposit a material upon the sample 222.

The voltage power supply 234 is connected to the ion source 214 as well as to appropriate electrodes in the ion beam focusing column 216 for forming the ion beam 218 with an energy of approximately 1 keV to 60 keV and for directing the ion beam 218 toward the sample 222. The CPM system 210 additionally may include a deflection controller and amplifier 236 that is coupled to the deflection plates 220. The deflection controller and amplifier 236 may be operated in accordance with a prescribed pattern provided by a pattern generator 238 such that the ion beam 218 may be controlled manually or automatically to move along a corresponding pattern on the upper surface of the sample 222. In some systems, the deflection plates 220 may be positioned upstream of the final lens.

In some examples, beam blanking electrodes may be positioned within the ion beam focusing column 216 to cause the ion beam 218 to impact a blanking aperture instead of the sample 222 when a blanking controller applies a blanking voltage to the blanking electrode.

The ion source 214 can provide a metal ion beam of any suitable composition, such as gallium. In characteristic examples, the FIB system 211 can be configured to focus the ion beam 218 to a spot size of less than 0.1 micrometer (μm) at the sample 222, which may be used for modifying the sample 222 (e.g., by ion milling, enhanced etch, and/or material deposition) or for imaging the sample 222.

With continued reference to FIG. 2, the CPM system 210 can include a charged particle detector 240, such as an Everhart-Thornley detector or multi-channel plate, which may be used for detecting secondary ion or electron emission. The charged particle detector 240 may be connected to a video circuit 242 that supplies drive signals to a video monitor 244 and that receives deflection signals from a system controller 219. The location of the charged particle detector 240 within the lower chamber 226 can vary in different examples. For example, the charged particle detector 240 can be coaxial with the electron beam 243 and can include a hole for allowing the electron beam 243 to pass therethrough. In other embodiments, secondary particles can be collected through a final lens and then diverted off-axis for collection by the charged particle detector 240.

A micromanipulator 247 can precisely move objects within the vacuum chamber. Micromanipulator 247 may include precision electric motors 248 positioned outside the vacuum chamber to provide X, Y, Z, and theta control of a portion 249 positioned within the vacuum chamber. The micromanipulator 247 can be fitted with different end effectors for manipulating small objects. In the embodiments described herein, the end effector is a thin probe 250. Additionally or alternatively, in some examples, the micromanipulator 247, the end effector, and/or the thin probe 250 can include and/or be a replaceable needle, such as a replaceable tungsten needle.

In some examples, a gas delivery system 246 extends into lower chamber 226 for introducing and directing a gaseous vapor toward the sample 222. Examples of such gas delivery systems are disclosed in U.S. Pat. No. 5,851,413 and in U.S. Pat. No. 5,435,850, the disclosures of which are hereby incorporated by reference. For example, a metal organic compound can be delivered to the beam impact point to deposit a metal upon impact of the ion beam or the electron beam. A precursor gas, such as $(CH_3)_3Pt(CpCH_3)$ to deposit platinum or tungsten hexcarbonyl to deposit tungsten, can be delivered to be decomposed by the electron beam 243.

The system controller 219 can be programmed and/or configured to control the operations of various aspects of the CPM system 210. For example, through the system controller 219, a user can cause the ion beam 218 or the electron beam 243 to be scanned in a desired manner through commands entered into a user interface of the system controller 219. Additionally or alternatively, the system controller 219 may control the CPM system 210 in accordance with programmed instructions. A preferred controller is in communication with or includes a memory 270 that stores instructions for automatically carrying out one or more steps, such as one or aspects of the methods disclosed herein. Further aspects and/or examples of the system controller 219 are disclosed herein with reference to the system controller 102 of FIG. 1 and/or the PC 1200 of FIG. 12. For example, the memory 270 of the system controller 219 can represent the memory 135 of FIG. 1 and/or the memory 1290 of FIG. 12.

In some embodiments, the CPM system 210 incorporates image recognition software to automatically identify regions of interest in which aspects of the present disclosure may be performed. For example, the system could automatically locate similar features on semiconductor wafers including multiple devices and expose and form images of features of interest on different (or the same) devices.

In some examples, and as discussed above, the CPM system 210 can include a motion stage disposed on the bulk sample stage 225. In some such examples, the sample stage 225 can translate in at least the x- and y-directions (e.g., in the x-y plane), and the motion stage can translate independently in the z-direction and/or rotate about an axis. Using such a motion stage on top of the sample stage 225 may enable a user to view almost all positions and directions relative to the sample 222 by milling and viewing into a volume. Thus, when a sample is removed from a bulk sample and strategically placed onto the motion stage, the sample can be positioned to any desired location and in any desired orientation. Such adjustability in positioning the sample can, for example, enable the sample to be positioned at short working distance and perpendicular to an electron beam of an electron microscope to obtain high resolution images.

In some examples, the FIB system 211 may be used to prepare a sample specimen for observation by the SEM 241, such as by removing material from the sample specimen. In some such examples, the sample 222 is a bulk sample from which the sample specimen is extracted for analysis. The sample specimen may be extracted from the bulk sample in any suitable manner, such as by using the FIB system 211 to remove material surrounding the sample specimen. The extracted sample specimen may then be mounted to a sample holder (e.g., the sample holder 224) on an independent motion stage. The sample holder can include and/or be a needle type sample holder and/or a grid type sample holder. The independent motion stage allows sample to milled and viewed simultaneously from almost any direction. The sample can then also be viewed at 90 degrees and at a shorter working distance to the electron beam for high resolution characterization. Multi-plane sample access with a single weld and independent motion opens up many possibilities for users to explore the “dimensions” of their samples. For example, the user can cross section the sample from one direction to locate a region of interest (ROI), and then cut the sample from another direction to characterize it from a completely different direction.

Further examples of CPM systems, of components thereof, and/or of associated methods are disclosed in U.S. Pat. No. 9,488,554 and in U.S. Pat. No. 9,653,260, the disclosures of which are hereby incorporated by reference. While the present disclosure generally relates to examples in which the CPM system 210 includes an SEM 241 for imaging the sample 222, this is not required of all examples. For example, it additionally is within the scope of the present disclosure that the systems and methods disclosed herein can be used in conjunction with any suitable CPM configuration, examples of which include a transmission electron microscope (TEM), a scanning transmission electron microscope (STEM), etc.

Sample Specimen Processing

Figure 3:
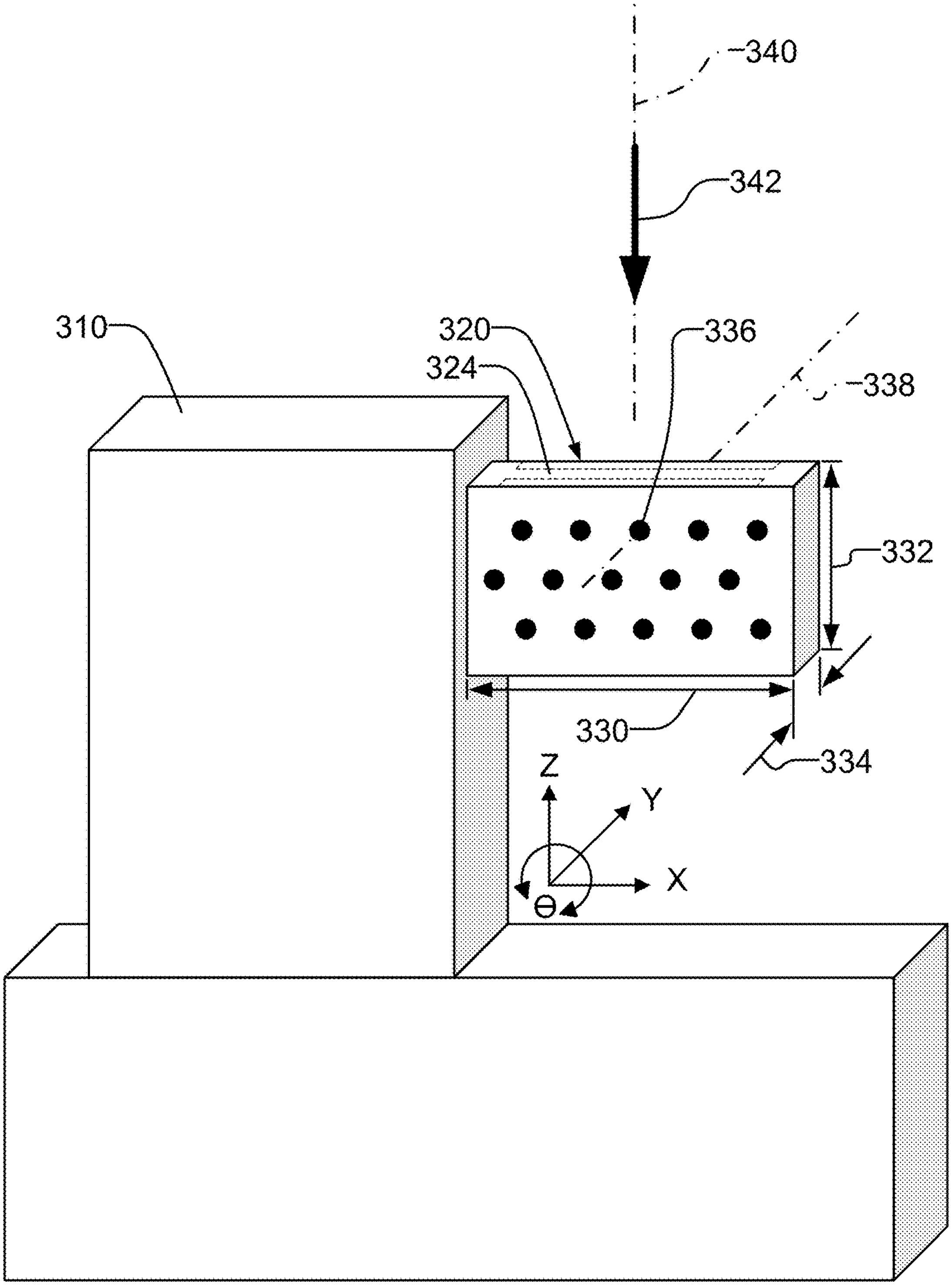
FIG. 3 is a top side view of a sample specimen supported by a sample holder in a default orientation relative to a processing axis of an ion beam according to an example.

FIG. 3 illustrates an example of a sample specimen 320 that is supported by a sample holder 310 relative to an ion beam 342. The sample specimen 320 can represent a sample specimen extracted from the bulk sample 222 of FIG. 2. Similarly, the sample holder 310 can represent the sample holder 224 of FIG. 2, and/or the ion beam 342 can represent the ion beam 218 of the FIB system 211 of FIG. 2. The sample specimen 320 can be mounted to and/or affixed to the sample holder 310 in any suitable manner, such as by a platinum weld.

As shown in FIG. 3, the ion beam 342 is directed toward the sample specimen 320 along a direction parallel to a processing axis 340, which in the configuration of FIG. 3 is parallel to the z-axis. As used herein, the term “processing axis” is intended to refer to a direction relative to the sample specimen 320, and thus may be understood as representing and/or encompassing a set of axes directed along such a direction. For example, while FIG. 3 illustrates the processing axis 340 as the axis along which the ion beam 342 travels, any other axis parallel to the z-axis in FIG. 3 also may be described as representing the processing axis 340 in this example.

The ion beam 342 can be moved relative to the sample specimen 320 (e.g., along the x- and/or y-directions of FIG. 3), such as by movement of the sample holder 310 and/or deflection of the ion beam 342, to remove material from the sample specimen 320. In particular, the ion beam 342 may be scanned across a portion of the sample specimen 320 to prepare a thin lamella 324, such as to prepare the sample specimen 320 for TEM analysis. In the example of FIG. 3, the dashed regions of the sample specimen 320 may be understood as representing the regions along which the ion beam 342 is scanned and which are removed by the ion beam 342, thus producing the lamella 324.

As shown in FIG. 3, the sample specimen 320 may be characterized by a sample width 330 as measured along the x-direction, a sample height 332 as measured along the z-direction, and/or a sample thickness 334 as measured along the y-direction. In various examples, the sample width 330 and/or the sample height 332 may be on the order of tens of micrometers, while the sample thickness 334 may be on the order of micrometers. Subsequent to thinning the sample specimen 320 with the ion beam 342, the lamella 324 may have a lamella thickness (as measured along the y-direction) that is about 0.5-1.5 micrometers.

In preparing the sample specimen 320 for TEM analysis, it generally is desirable that the lamella 324 be formed with a consistent thickness. In some cases, however, various material features and/or properties of the sample specimen 320 can yield inconsistencies in the thickness of a lamella produced by such FIB milling. For example, FIG. 3 illustrates a sample specimen 320 that includes a plurality of discrete features 336 that are etched by the ion beam 342 at different rates than the surrounding material. As examples, the discrete features 336 may represent holes and/or channels extending through the sample specimen 320 or may represent material inhomogeneities with material properties (e.g., density) that yield different etch rates than the surrounding material.

In the example of FIG. 3, the discrete features 336 include high-aspect-ratio structures and/or features that extend through the sample specimen 320 along respective feature axes 338 and are distributed in a periodic arrangement. In particular, in the configuration of FIG. 3, the discrete features 336 are arranged in columns that are aligned relative to the processing axis 340.

As a result, when the ion beam 342 is scanned across the sample specimen 320, the ion beam 342 may remove different amounts of material when the ion beam 342 is directed at a series of aligned discrete features 336 relative to when the ion beam 342 is directed to a region between the discrete features 336. For example, the average etch rate of the material encountered by the ion beam 342 at a given position along the x-axis varies significantly depending on whether the given position along the x-axis is aligned with a series of the discrete features 336.

As used herein, the term “high-aspect-ratio” may be used to describe a feature and/or structure with an extent in one direction that is significantly larger (e.g., at least twice as large, at least three times as large, and/or at least five times as large) as an extent of the feature and/or structure in each other direction. For example, each of the discrete features 336 of FIG. 3 has a dimension as measured along the respective feature axis 338 that is significantly larger than dimensions of each such feature as measured along the x- and z-directions. Additionally, in the example of FIG. 3, each of the discrete features 336 may be described as representing a portion of a larger (e.g., longer) high-aspect-ratio feature of the bulk sample from which the sample specimen 320 was extracted. In this manner, each of the discrete features 336 may be described as representing a portion of a high-aspect-ratio structure of the bulk sample even when such discrete features 336 are included in a sample specimen 320 or lamella 324 with limited extent along the feature axes 338.

Figure 4:
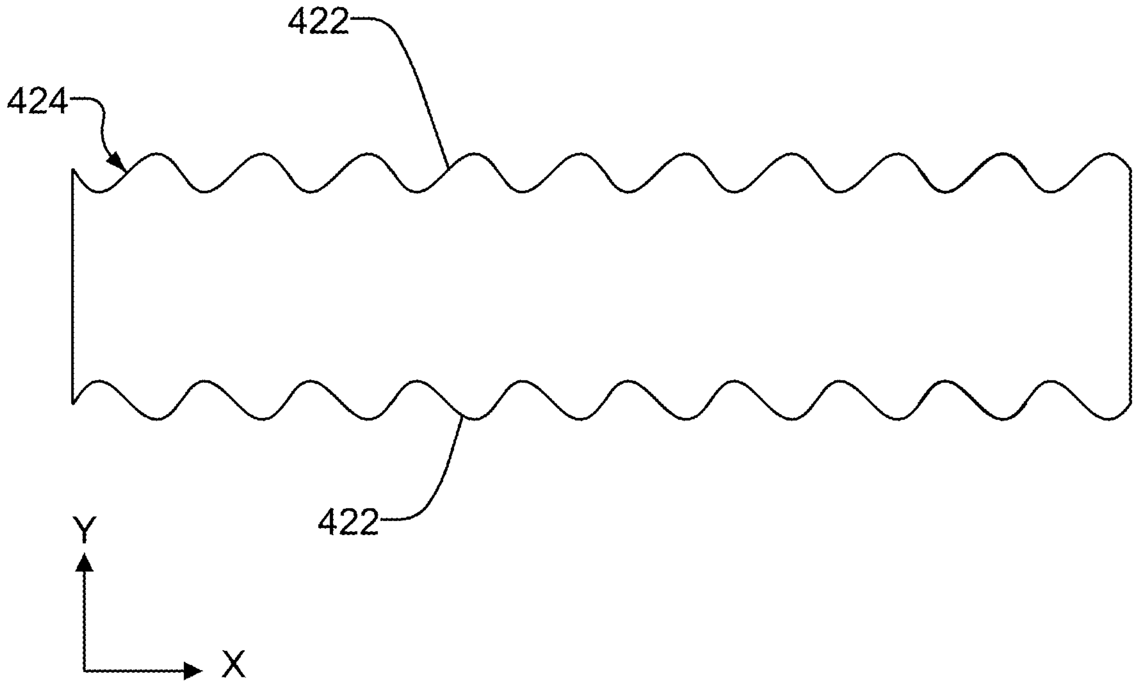
FIG. 4 is a top view of a sample specimen exhibiting curtaining artifacts according to an example.

FIG. 4 illustrates an example profile of a lamella 424 that may be produced by such an operation, such as the lamella 324 of FIG. 3 subsequent to milling with the ion beam 342. In particular, in the example of FIG. 4, the lamella 424 is produced with surfaces 422 that are uneven as a result of the differential rates of material removal produced by the discrete features 336 shown in FIG. 3. Such an effect, which may be described as a curtaining artifact, may result in the lamella 424 being ill-suited for TEM analysis as a result of the widely varying thickness thereof.

Figure 5:
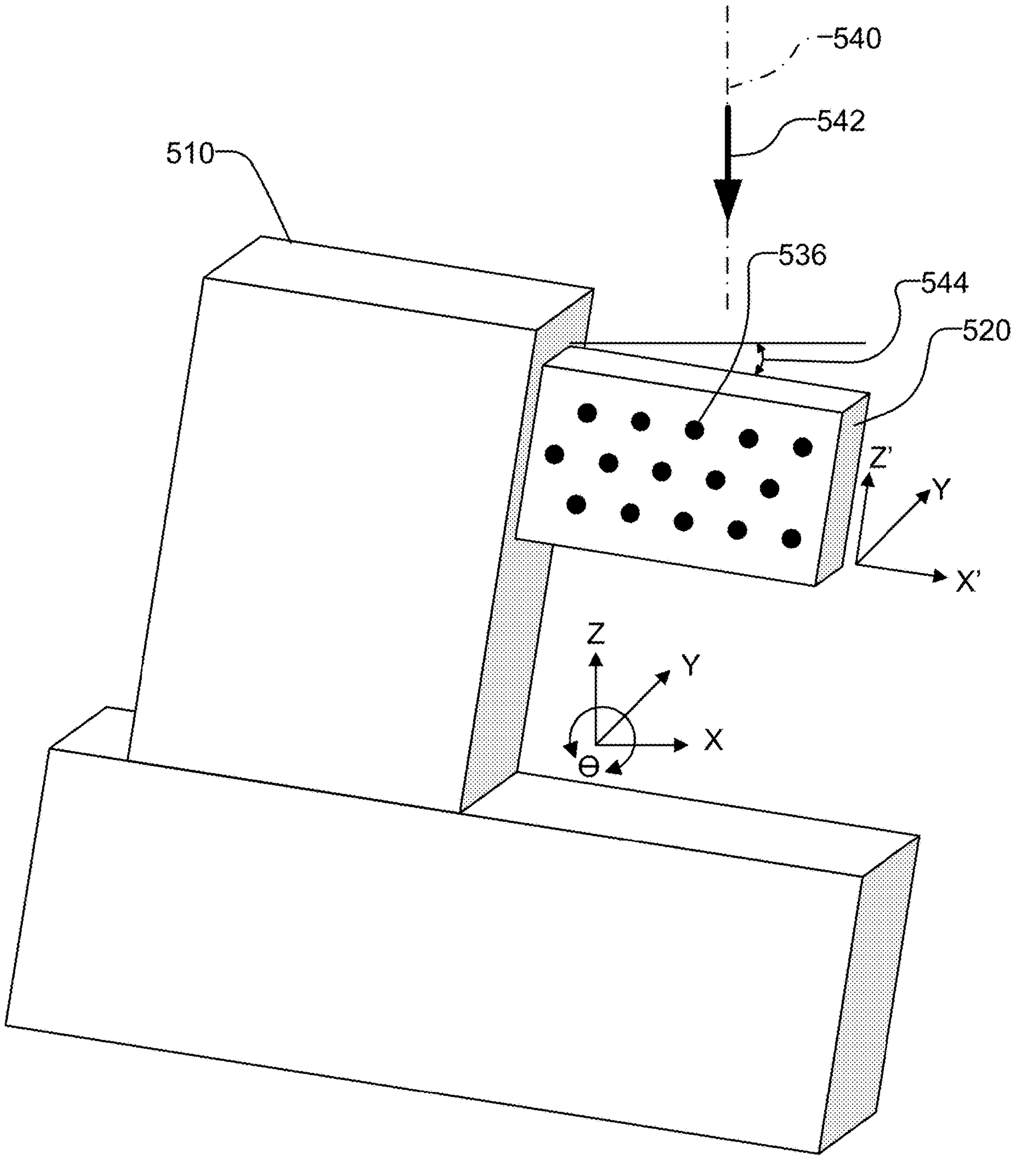
FIG. 5 is a top side view of the sample specimen and sample holder of FIG. 3 rotated away from the default orientation according to an example.

Similar to FIG. 3, FIG. 5 illustrates a configuration in which a sample specimen 520 is supported by a sample holder 510 relative to an ion beam 542 traveling along a direction parallel to a processing axis 540. Specifically, the sample holder 510 and the sample specimen 520 of FIG. 5 represent the sample holder 310 and the sample specimen 320 of FIG. 3 rotated about the y-axis by a sample tilt angle 544. The configuration of FIG. 5 thus may be characterized with reference to the x-y-z coordinate axes shown in FIG. 3 (with the z-axis parallel to the processing axis 340/540) or with reference to the rotated x'-y-z' coordinate axes shown in FIG. 3 (with a surface of the sample specimen 520 extending in the x'-z' plane).

As a result of rotating the sample specimen 520 relative to the processing axis 540 by the sample tilt angle 544, the discrete features 536 (which correspond to the discrete features 336 of FIG. 3) are at least partially misaligned with one another as viewed along the processing axis 540. As a result, when the ion beam 542 is scanned across the sample specimen 520, the ion beam 542 may remove similar amounts of material from the sample specimen 520 at each point along the x-axis. For example, the average etch rate of the material encountered by the ion beam 542 at a given position along the x-axis may be relatively consistent along the x-axis as a result of the effects of the discrete features 536 being effectively spread out along the x-axis.

As used herein, the term "etch rate" may be used to describe and/or refer to any suitable metric characterizing a rate at which the sample specimen 520 is milled by the ion beam 542. For example, the etch rate may be expressed in units of thickness of sample milled per unit time, mass of sample milled per unit time, etc. Additionally, it is to be understood that the etch rate generally will depend upon the properties of the ion beam 542 (e.g., ion species, accelerating voltage, focus spot size, etc.) as well as upon properties of the sample specimen 520 (e.g., material composition). For the purposes of the present disclosure, it generally is sufficient to consider the etch rates characterizing different materials of the sample specimen 520 only as relative quantities, such that any suitable definition and/or quantification of such etch rates may be used.

Figure 6:
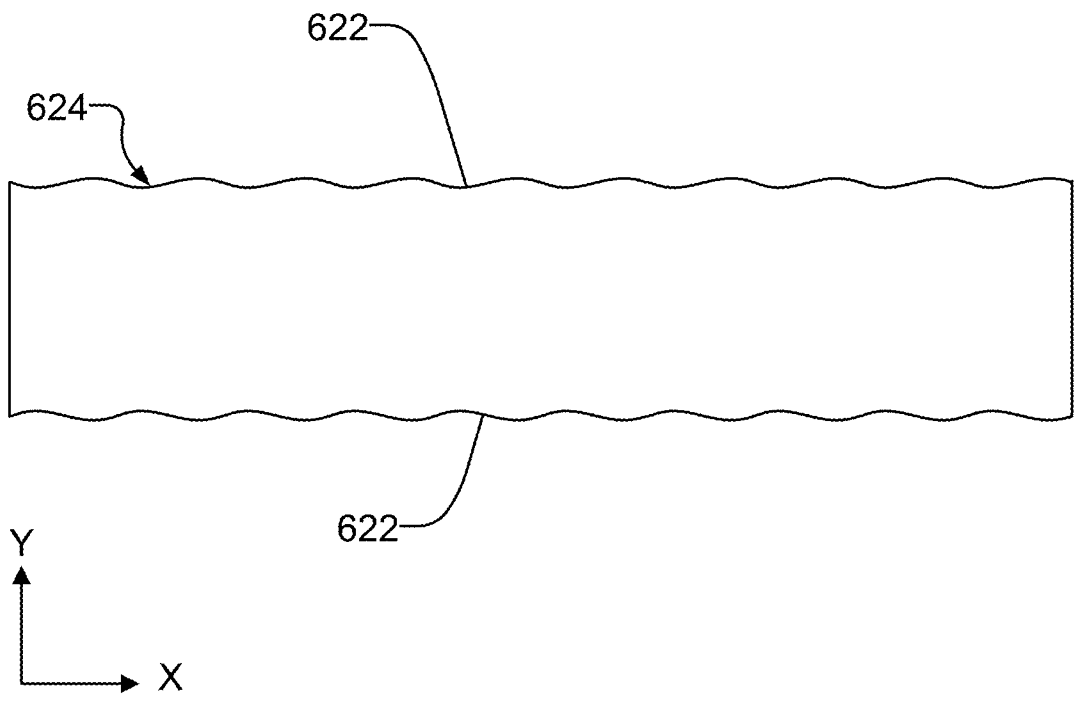
FIG. 6 is a top view of a sample specimen exhibiting lessened curtaining artifacts according to an example.

FIG. 6 illustrates an example profile of a lamella 624 that may be produced by such an operation. In particular, comparing the lamellae of FIGS. 4 and 6, it may be seen that the surfaces 622 of the lamella 624 of FIG. 6 are significantly less uneven as a result of orienting the sample specimen 520 in a manner that mitigates the curtaining effects introduced by the discrete features 536.

In general, the extent to which the curtaining effects in a FIB-milled lamella are mitigated will depend upon the sample tilt angle 544 by which the sample specimen 520 is tilted relative to the processing axis 540. Disclosed herein are methods of determining a preferred value of the sample tilt angle 544, or, equivalently, a preferred orientation of the processing axis 540 relative to the sample specimen 520, based upon observed and/or known physical properties of the sample specimen 520. In particular, the methods disclosed herein can be used to determine a preferred processing axis and/or a preferred sample tilt angle that minimizes and/or mitigates a curtaining effect. Such methods additionally or alternatively may serve to improves and/or optimizes one or more physical characteristics of a lamella milled by an ion beam, such as by enabling the lamella to be formed with a uniform thickness. As described in more detail herein, such methods may be performed at least substantially automatically and/or without requiring user manipulation of the sample specimen. Such methods also may be performed in conjunction with sample specimens exhibiting any configuration and/or pattern of material properties and can be based on any suitable combination of known and measured properties of the sample specimen.

Exemplary Methods

Figure 7:
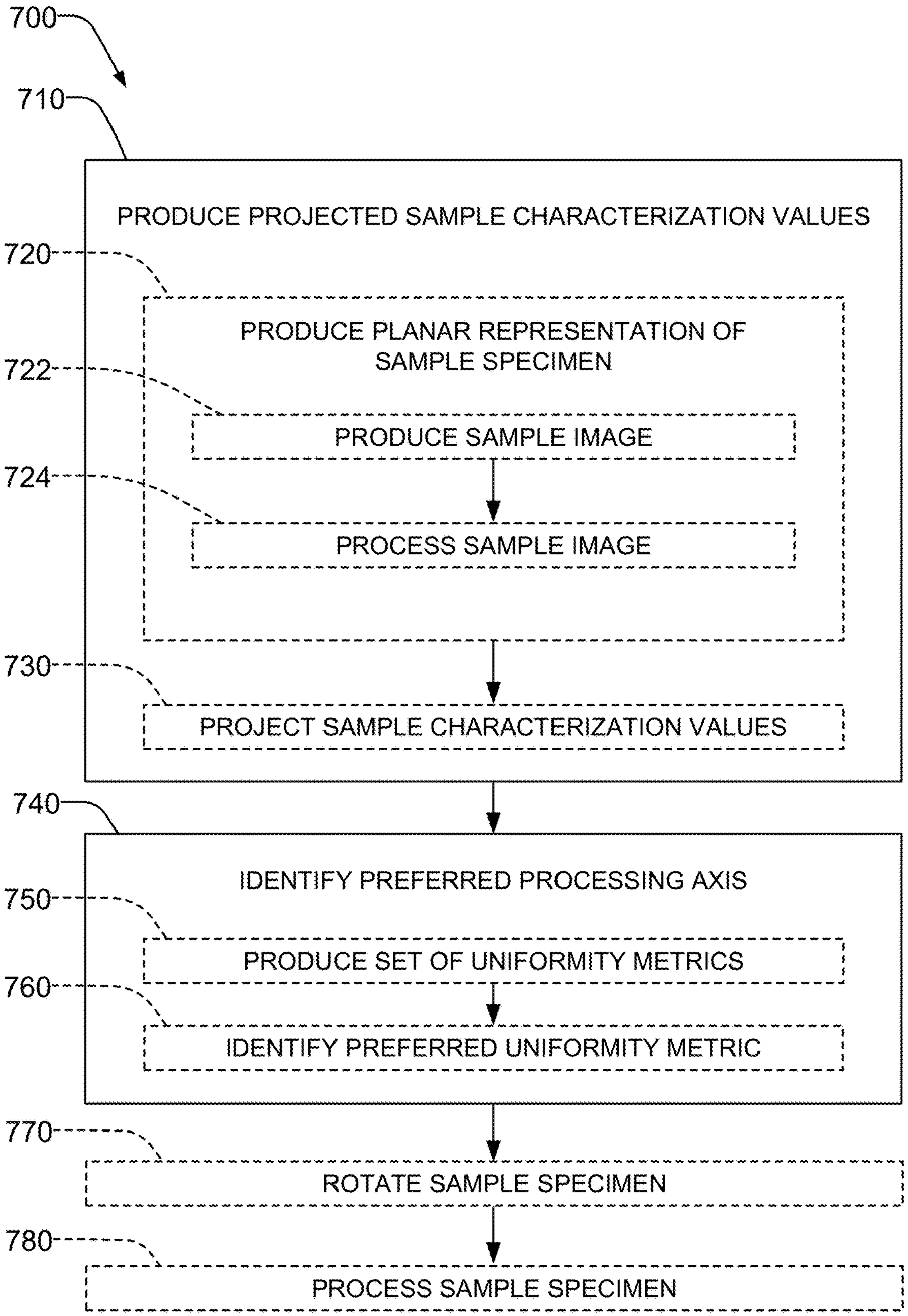
FIG. 7 is a flow chart depicting methods of preparing a sample for observation with a charged particle microscope according to an example.

FIG. 7 is a flowchart depicting examples of a method 700 of preparing a sample specimen, such as for measurement by a SEM, a TEM, and/or a STEM (e.g., using the SEM 241 of FIG. 2). As shown in FIG. 7, the method 700 includes, at 710 and with a controller, producing a set of projected sample characterization values associated with each of a plurality of processing axes. The method 700 additionally includes, at 740 and with the controller, identifying a preferred processing axis based upon the projected sample characterization values.

The controller used in the performance of the method 700 can include and/or be any suitable controller, such as the system controller 102 of FIG. 1 and/or any of the controllers disclosed herein with reference to FIG. 2. Further examples of such controllers and/or of portions thereof are described in more detail below with reference to FIG. 12.

In FIG. 7, steps and/or aspects of the method 700 presented in dashed lines may be described as optional and/or as corresponding to selected examples of the method 700, while steps and/or aspects of the method 700 presented in solid lines may be regarded as pertaining to most and/or all examples. It is to be understood, however, that any suitable combination of the steps and/or aspects of the method 700 depicted in FIG. 7 may be performed in any example of the method 700.

As described in more detail below, the projected sample characterization values may be understood as representing the effects of spatially varying material properties of the sample specimen (e.g., associated with the discrete features 336/536 of FIGS. 3 and 5 and/or other varying material properties) as projected along a direction corresponding to each processing axis.

In some examples, variations in the projected sample characterization values associated with a given processing axis may be understood as representing expected and/or modeled variations of thickness of a sample that is milled with an ion beam that is directed to the sample specimen along the processing axis. Accordingly, and as described in more detail herein, processing and/or analysis of such projected sample characterization values can enable the determination of the preferred processing axis along which the sample specimen may be milled to enhance and/or optimize the uniformity of the resulting lamella.

In the present disclosure, an orientation of the sample specimen and/or of the ion beam relative to one another and/or relative to other components may be described with reference to a sample tilt angle (e.g., the sample tilt angle 544 of FIG. 5) and/or with reference to a processing axis (e.g., the processing axes 340/540 of FIGS. 3 and 5). As used herein, the terms "sample tilt angle" and "processing axis" may be used interchangeably to represent and/or refer to the orientation of the sample specimen relative to the ion beam. For example, as used herein, the term "sample tilt angle" may be understood as referring to an angular orientation of the sample specimen relative to the ion beam, while the term "processing axis" may be understood as referring to an angular orientation of the ion beam relative to the sample specimen. Accordingly, references herein to properties associated with a sample tilt angle equivalently may be understood as referring to properties associated with the processing axis that corresponds to such a sample tilt angle, and vice-versa. Similarly, references herein to an angular measurement (e.g., as expressed in degrees) equivalently may be understood as quantifying a sample tilt angle and/or an associated processing axis.

In some examples, and as shown in FIG. 7, the producing the projected sample characterization values at 710 includes producing, at 720, a planar representation of a sample specimen, such as in an orientation corresponding to the processing axis. As described in more detail below, the planar representation includes and/or is a set of sample characterization values mapped onto a two-dimensional array of representation locations corresponding to respective portions of the sample specimen. The producing the projected sample characterization values at 710 additionally may include projecting, at 730, the sample characterization values along an axis of the planar representation corresponding to the processing axis to produce the set of projected sample characterization values.

In various examples, and as shown in FIG. 7, the identifying the preferred processing axis at 740 includes producing, at 750 and with the controller, a set of uniformity metrics corresponding to the plurality of processing axes investigated. Each uniformity metric corresponds to the set of projected sample characterization values associated with the corresponding processing axis. In such examples, the identifying the preferred processing axis at 740 further includes identifying, at 760 and with the controller, a preferred uniformity metric of the set of uniformity metrics. The preferred processing axis thus can be identified as representing the processing axis corresponding to the preferred uniformity metric.

In some examples, the method 700 includes one or more steps associated with manipulating and/or processing the sample specimen based upon the preferred processing axis identified at 740. For example, and as shown in FIG. 7, the method 700 can include rotating, at 770, the sample specimen and/or processing, at 780, the sample specimen.

The rotating the sample specimen at 770 can include rotating the sample by the sample tilt angle and/or such that the ion beam approaches the sample specimen along the preferred processing axis. In some examples, the rotating the sample specimen at 770 is performed by a stage and/or sample holder supporting the sample (e.g., the stage 122 of FIG. 1, the stage 225 of FIG. 2, the sample holder 224 of FIG. 2, and/or the sample holder 310 of FIG. 3). In some examples, the rotating the sample specimen at 770 is performed responsive to a command generated and/or transmitted by the controller.

In some examples, the rotating the sample specimen at 770 is performed prior to (e.g., immediately prior to) the processing the sample specimen at 780, such as to prepare the sample specimen for processing along the identified preferred processing axis. Additionally or alternatively, one or more other steps of the method 700, such as the producing the planar representation of the sample specimen at 720 and/or the identifying the preferred processing axis at 740, may be performed (e.g., repeated) subsequent to the rotating the sample specimen at 770. For example, subsequent to the rotating the sample specimen at 770, the method 700 can include repeating the producing the planar representation of the sample specimen at 720 to produce an updated planar representation corresponding to the rotated sample specimen. Additionally or alternatively, subsequent to the rotating the sample specimen at 770, the method 700 can include repeating the identifying the preferred processing axis at 740, such as based upon the updated planar representation. In this manner, repeating one or more of the producing the planar representation of the sample specimen at 720, the identifying the preferred processing axis at 740, and/or the rotating the sample specimen at 770 (and/or any sub-steps thereof) can allow for iterative refinement and/or confirmation of the preferred processing axis.

The processing the sample specimen at 780 can include processing in any suitable manner. For example, the processing the sample specimen at 780 can include milling the sample specimen with an ion beam (e.g., the ion beam 218 of the FIB system 211) along the preferred processing axis, such as to produce a lamella as described herein. As used herein, the term "processing," as used to describe an action performed upon the sample specimen, may be understood as encompassing any suitable FIB milling processes.

As described herein, the producing the set of projected sample characterization values at 710 includes producing such a set of projected sample characterization values associated with each of a plurality of processing axes. Accordingly, each of the producing the planar representation of the sample specimen at 720 and the projecting the sample characterization values at 730 is performed with respect to each of the plurality of processing axes under consideration.

In some examples, the producing the set of uniformity metrics at 750 includes determining the uniformity metric at each of a plurality of processing axes in a test range of processing axes and/or sample tilt angles. The test range of processing axes and/or sample tilt angles used in the performance of the method 700 may be determined and/or selected in any suitable manner. In some examples, the processing axis and/or the sample tilt angle may be defined with respect to a default orientation in which the processing axis of the ion beam is parallel to a major axis of the sample specimen, such as in the example of FIG. 3. In particular, FIG. 3 may be described as representing an example in which the sample tilt angle is zero.

In various examples described herein, the test range of processing axes encompasses a range from −10 degrees to +10 degrees; it is to be understood, however, that any suitable angular range may be used. In some examples, the angular range representing the test range of processing axes may be at least partially based on a range of motion of a sample holder and/or an associated motion stage supporting the sample specimen.

Additionally, the processing axes used in the performance of the method 700 may include any subset of the full range of processing axes in the test range of processing axes. For example, the method 700 may include repeating the identifying the preferred uniformity metric at 760 at processing axes that are separated by a common angular interval, such as 0.1 degrees, 1 degree, 2 degrees, or more than 2 degrees.

Figure 8A:
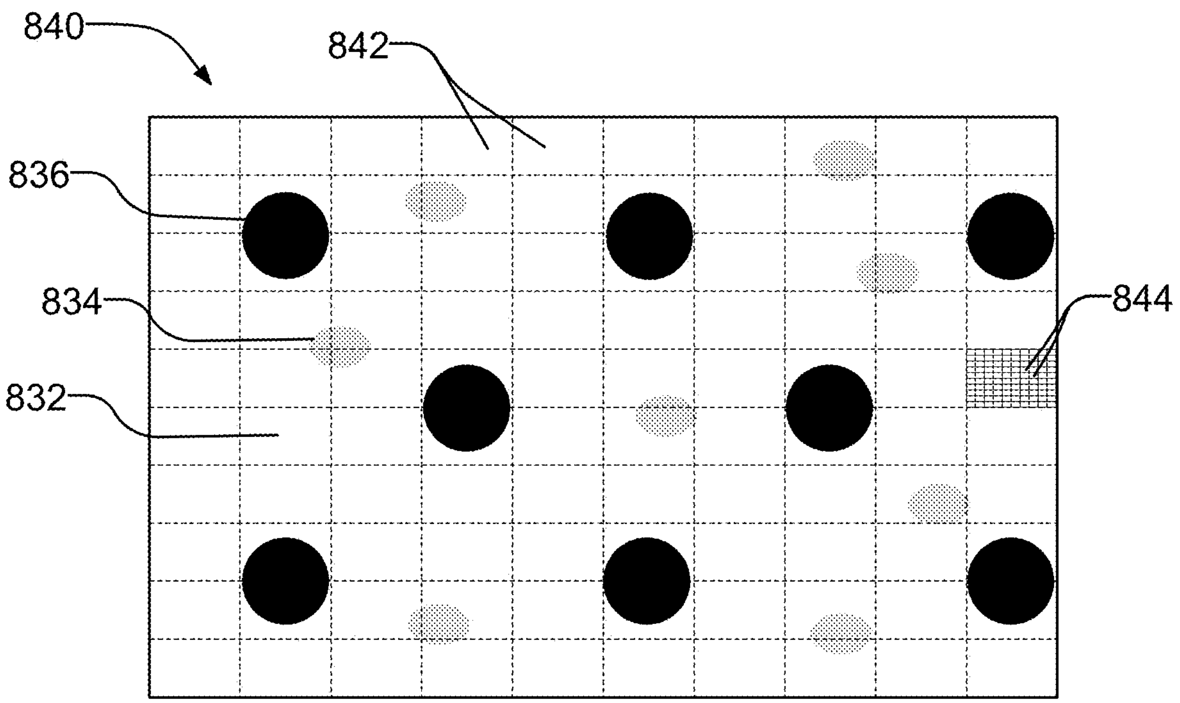
FIG. 8A is an illustration of a sample image according to an example.
Figure 8B:
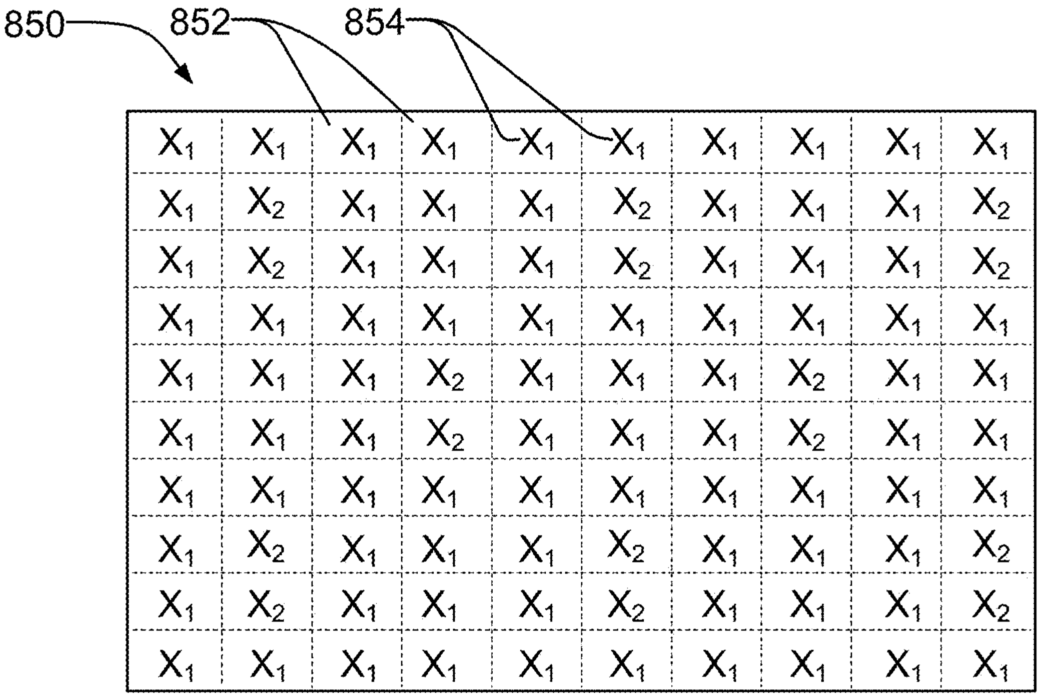
FIG. 8B is a visual depiction of a planar representation representing the sample image of FIG. 8A according to an example.

An example of a manner in which the planar representation of the sample specimen may be produced is shown in FIGS. 8A-8B. FIG. 8A illustrates an example of a sample image 840 representing the sample specimen, such as in a region of interest. For example, the sample image 840 of FIG. 8A may be described as depicting the sample specimen 320 of FIG. 3 as viewed in the x-z plane.

While the present disclosure generally describes and/or illustrates the sample image 840 as being a graphically represented image, it is to be understood that the sample image 840 may include and/or be any suitable data structure that can correspond to such a graphical representation, and that such a graphical representation need not be generated and/or displayed during the performance of the method 700.

The sample image 840 may be partitioned into a plurality of sample image regions 842, each of which represents a respective portion of the sample specimen. In the example of FIG. 8A, each sample image region 842 includes and/or corresponds to a respective plurality of sample image pixels 844 that form the sample image 840. In other examples, each sample image region 842 may include and/or correspond to a single respective sample image pixel 844.

Additionally or alternatively, in some examples, each image pixel 844 can represent and/or correspond to a plurality of sub-pixels that in turn represent sample information at a finer spatial resolution than the image pixels 844. Accordingly, in some examples, such as when the sample image 840 corresponds to an image configured to be graphically represented, each sample image region 842 can include and/or correspond to a plurality of sample image pixels 844, each of which includes and/or corresponds to a plurality of sub-pixels. In other examples, each sample image region 842 can include and/or correspond to one or more sub-pixels of the sample image 840. For example, the sample image 840 may correspond to an image and/or data structure with image pixels 844 configured to be displayed graphically, while each sample image region 842 that is used to represent the sample image 840 (as discussed below) can correspond to one or more sub-pixels. Thus, in such an example, each sample image region 842 may represent a finer degree of spatial resolution than the image pixels 844.

FIG. 8B illustrates an example of a planar representation 850 that may be produced based on the sample image 840 of FIG. 8A. The planar representation 850 includes an array of representation locations 852, each corresponding to a respective sample image region 842 of the sample image 840, and each associated with a respective sample characterization value 854. The sample characterization values 854 thus may be understood as representing one or more aspects or properties of the sample specimen associated with the sample image region 842 corresponding to the associated representation location 852.

In general, each uniformity metric corresponds to a quantity with a reduced dimensionality relative to the set of projected sample characterization values associated with the corresponding processing axis, while the set of projected sample characterization values has a reduced dimensionality relative to the planar representation of the sample specimen. In this manner, the uniformity metric associated with each processing axis may be described as a reduced-dimensionality representation of the sample characterization values of the planar representation with respect to a corresponding processing axis. Each processing axis thus may be associated with a respective uniformity metric value.

In the example of FIG. 8B, each representation location 852 corresponding to a sample image region 842 that exhibits a first visual property (e.g., filled with white or gray space) is associated with a sample characterization value 854 of $X_1$. Similarly, each representation location 852 corresponding to a sample image region 842 that exhibits a second visual property (e.g., partially occupied by a discrete feature, such as in the sample image region 836) is associated with a sample characterization value 854 of $X_2$.

While the present disclosure generally is directed to examples in which the planar representation 850 is described and/or illustrated as a two-dimensional array, it is to be understood that the planar representation 850 may include and/or be any suitable data structure and that the controller may transform such a data structure in any suitable manner corresponding to the method steps described herein.

Each sample characterization value 854 can have any of a variety of forms and/or structures. For example, each sample characterization value 854 can include and/or be a scalar quantity or a multi-dimensional (e.g., vector) quantity.

In some examples, each sample characterization value 854 includes, or is, a numerical quantity characterizing a material property associated with the corresponding representation location 852. As an example, such a material property may represent a density of the sample specimen at a location corresponding to the representation location. As another example, such a material property may represent a rate (e.g., a relative and/or absolute rate) at which a portion of the sample specimen corresponding to the representation location will be milled by an ion beam.

In examples in which each sample characterization value 854 includes a multi-dimensional quantity, each sample characterization value 854 can represent multiple distinct material properties associated with the representation location 852, respective values of an anisotropic material property associated with the representation location 852 as measured along different directions, etc.

Producing the planar representation 850 based upon the sample image 840 may be performed in any of a variety of manners. For example, and as shown in FIG. 7, the producing the planar representation of the sample specimen at 720 can include producing, at 722, a sample image (e.g., the sample image 840) and processing, at 720, the sample image to produce the planar representation (e.g., the planar representation 850). Any or all of the producing the planar representation of the sample specimen at 720, the producing the sample image at 722, and/or the processing the sample image at 724 can be performed, at least in part, by the controller.

The producing the sample image at 722 can be performed in any of a variety of manners. For example, the producing the sample image at 722 can include capturing and/or recording the sample image, such as by capturing a micrograph image of the sample specimen (e.g., with the SEM 241 of FIG. 2). Additionally or alternatively, the producing the sample image at 722 can include imaging an exposed surface of the sample specimen, such as a surface of the sample specimen 320 extending in the x-z plane shown in FIG. 3. In such examples, the x-z plane (and/or another plane in which the exposed surface extends) may be referred to as a surface plane of the sample specimen. In other examples, the producing the sample image at 722 can include retrieving a previously captured, generated, and/or stored image of the sample specimen with the controller.

The processing the sample image at 724 also can be performed in any of a variety of manners. In various examples, the processing the sample image at 724 includes mapping sample characterization values (e.g., the sample characterization values 854 of FIG. 8B) onto the two-dimensional array of representation locations of the planar representation (e.g., the representation locations 852 of FIG. 8B) at least partially based on the sample image. For example, with reference to FIGS. 8A-8B, the mapping the sample characterization values 854 onto the representation locations 852 can include assigning a respective sample characterization value 854 to each representation location 852 at least partially based on the image intensity values of the image pixels 844 forming the corresponding image region 842. Such image intensity values can include, represent, and/or be greyscale values associated with each image pixel 844, color values associated with each image pixel 844, and/or any other suitable quantity representing the sample image 840 at each image pixel 844.

The mapping the sample characterization values 854 onto the representation locations 852 can be performed in any suitable manner based upon the image intensity values. For example, the mapping may be performed such that each sample characterization value 854 corresponds to the image intensity values of the image pixel(s) 844 of the respective image region 842 according to a predetermined transfer function. As a more specific example, such a transfer function may assign each sample characterization value 854 to be proportional to and/or otherwise uniquely correlated to the image intensity values of one or more image pixels 844 in the respective image region 842 (e.g., an average image intensity value in the respective image region 842). The use of such a transfer function may facilitate generating the planar representation 850 such that each sample characterization value 854 can assume any of a range and/or spectrum of values. This may be particularly beneficial, for example, when the sample image 840 represents a plurality of (e.g., more than two) material properties to be represented in the planar representation 850 with respective sample characterization values.

Additionally or alternatively, such a transfer function may assign each sample characterization value 854 based upon a threshold filter, such as a function that assigns the sample characterization value 854 to be one of two values (e.g., zero or one) based upon a comparison of the image intensity value(s) to a threshold value. The use of such a transfer function and/or filter may be particularly appropriate in examples in which the sample specimen can be modeled as representing a small number of significantly distinct material properties.

For example, with reference to FIG. 8A, the sample specimen (or the sample image 840 thereof) can include a primary material at locations corresponding to one or more primary material image regions 832, various minor features at locations corresponding to one or more minor feature image regions 834, and a plurality of discrete features at locations corresponding to discrete feature image regions 836. The primary material can have a first material property (e.g., a density and/or an ion beam etch rate), while the minor features can have material properties similar to that of the primary material, and the discrete features can have material properties significantly different than those of the primary material. In such examples, application of a threshold filter to process the sample image 840 can operate to disregard the relatively minor variations in material properties between the primary material and the minor features and instead represent the discrete features alone as being materially distinct from the remainder of the sample specimen. In the context of FIGS. 8A-8B, application of such a threshold filter may be described as applying the sample characterization value $X_1$ to each representation location 852 corresponding to the primary material image regions 832 and the minor feature image regions 834 and applying the sample characterization value $X_2$ to each representation location 852 corresponding to the discrete feature image regions 836.

Additionally or alternatively, in some examples, the processing the sample image at 722 can include masking the sample image to isolate one or more features of the sample image. Such a masking operation can operate in a similar manner and/or with a similar effect as the threshold filtering described above, such as to isolate the discrete features in the discrete feature image regions 836 of FIG. 8A to produce the planar representation 850 of FIG. 8B.

Additionally or alternatively, in some examples, the producing the planar representation of the sample specimen at 720 and/or the processing the sample image at 724 can include comparing the sample image to one or more known characteristics of the sample specimen. As an example, the sample specimen may be known to include features with a well-defined shape (e.g., circular) and/or dimension (e.g., diameter) as viewed in the plane of the sample image, while the sample image may represent such features as having shapes and/or sizes that are slightly distorted and/or otherwise inaccurate. In such examples, the planar representation may be prepared such that these features are represented as having the known properties (e.g., shapes and/or dimensions) and as being positioned in a manner represented in the sample image.

As a more specific example, the sample specimen may include features that are known to be circular in the plane of the sample image, but which appear non-circular in the sample image (and/or in a processed, filtered, and/or masked version thereof). In such an example, the planar representation may be produced by representing such features as circular features positioned at locations corresponding to (e.g., centered at) the positions shown in the sample image. In all such examples, the producing the planar representation of the sample specimen at 720 can (but is not required to) include producing a modified version of the sample image that reflects the known properties of the sample specimen and producing the planar representation by processing the modified sample image.

In various examples, the processing the sample image at 722 includes determining a sample material property corresponding to each representation location and assigning the sample characterization values to the representation locations at least partially based upon the sample material property. In the above examples, the sample characterization values generally are identified and/or assigned based upon the sample image, such as based upon the image intensity values of the corresponding image pixels. Accordingly, in such examples, the sample material properties may be determined at least partially based on one or more features of the sample image. For example, such processing may serve to model the image intensity values of the sample image as being directly representative of the corresponding material properties.

Additionally or alternatively, in some examples, the sample material properties may be at least partially based upon a known material composition of the sample. For example, the processing the sample image at 724 may include associating each sample image region with a corresponding sample material known to be present in the sample specimen (e.g., based upon image intensity values of the image pixel(s) in the sample image region) and assigning the sample characterization values as corresponding with known material properties of such a sample material.

While the present disclosure generally relates to examples in which the producing the planar representation at 720 is performed using a sample image, this is not required of all examples. For example, it additionally is within the scope of the present disclosure that the producing the planar representation at 720 can be performed without reference to a sample image, such as based upon one or more known and/or user-input properties of the sample specimen. For example, the controller can store and/or receive sample specifications corresponding to a material composition of the sample specimen in a format other than an image and/or planar representation. In such examples, the producing the planar representation at 720 can include retrieving the sample specifications and mapping the sample characterization values to the representation locations of the planar representation based, at least in part, on the sample specifications.

In various examples, the producing the planar representation of the sample specimen at 720 may be performed such that the planar representation represents the sample specimen in any of a plurality of planes and/or at any of various milling stages. For example, with reference to FIG. 3, the planar representation may represent the sample specimen 320 as viewed in the x-z plane, while each discrete feature 336 modeled by the planar representation extends along a feature axis 338 (which is parallel to the y-axis in the example of FIG. 3). Thus, as the ion beam 342 mills and thins the sample specimen 320 to produce the lamella 324, the exposed surface of the sample specimen 320 will include a similar and/or the same pattern of discrete features 336 as viewed in the x-z plane, which in turn may be modeled by a similar and/or the same planar representation.

FIGS. 9A-11G represent examples of manners in which the planar representation of the sample specimen may be used to perform the identifying the preferred processing axis at 740. As discussed above, the curtaining effect associated with milling a sample specimen with periodically repeating structural features may be mitigated by milling the sample specimen along a processing axis along which such structural features are at least partially misaligned with one another. Accordingly, the identifying the preferred processing axis at 740 generally includes identifying a preferred processing axis that satisfies this condition.

Figure 9A:
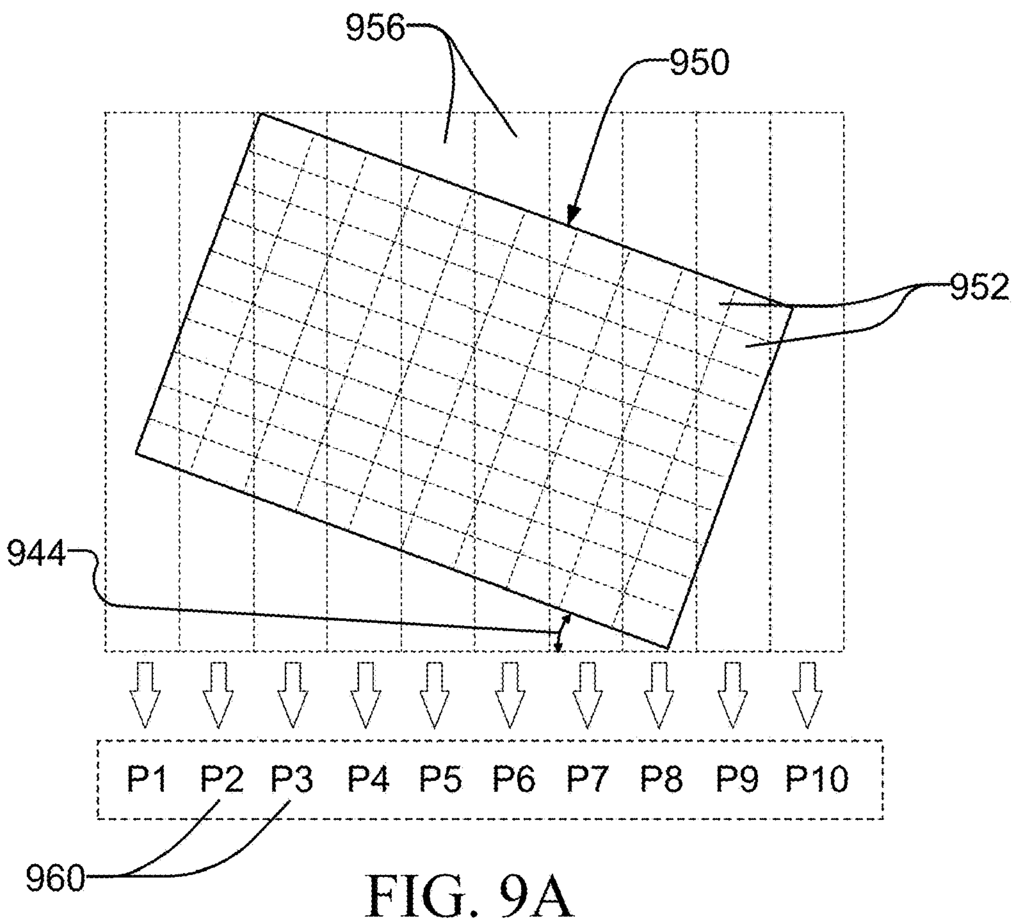
FIG. 9A is a visual depiction of a manner in which a set of projected sample characterization values may be produced from a planar representation according to an example.

As an example, FIG. 9A illustrates a planar representation 950 of a sample specimen that is rotated by a sample tilt angle 944 relative to a series of vertical columns 956. The planar representation 950 can represent the planar representation 850 of FIG. 8B or any other suitable planar representation. For simplicity, the planar representation 950 is illustrated as a grid of representation locations 952 corresponding to the sample characterization values that form the planar representation 950.

As discussed above, the sample tilt angle 944 may be understood as representing and/or corresponding to the processing axis. For example, the producing the planar representation of the sample specimen at 720 can include producing a default planar representation of the sample specimen in an orientation corresponding to a default processing axis and rotating the default planar representation by the sample tilt angle that corresponds to a difference between the processing axis under consideration and the default processing axis.

As a more specific example, the planar representation 850 of FIG. 8B may be described as representing a default planar representation corresponding to the default orientation of the sample specimen 320 of FIG. 3. Specifically, in this default orientation, the processing axis 340 extends parallel to the z-axis. The processing axis 340 shown in FIG. 3 thus may be described as a default processing axis. The planar representation 950 of FIG. 9A in turn may be described as representing the default planar representation 850 of FIG. 8B subsequent to a rotation by the sample tilt angle 944, which may correspond to and/or be the sample tilt angle 544 of FIG. 5. Accordingly, the planar representation 950 of FIG. 9A may be described as representing the sample specimen 520 as rotated relative to the ion beam 542 such that the processing axis 540 is no longer parallel to the z'-axis of the sample specimen 520. It is to be understood, however, that any orientation of the processing axis relative to the sample specimen may be regarded as the default processing axis.

With reference to FIG. 9A, with the planar representation 950 rotated to the sample tilt angle 944 corresponding to a selected processing axis, the projected sample characterization values may be generated by partitioning the planar representation 950 into a plurality of representation slices 956. For each representation slice 956, a corresponding portion of the planar representation 950 can be transformed into a corresponding projected sample characterization value 960.

Each representation slice 956 may be described as representing and/or including a respective subset of the sample characterization values of the planar representation 950. In some examples, transforming the portion of the planar representation 950 into the corresponding projected sample characterization value 960 for a selected representation slice 956 includes transforming such that the projected sample characterization value 960 represents the sample characterization values contained within and/or otherwise associated with the representation slice 956. In particular, the present disclosure generally is directed to examples in which each projected sample characterization value 960 represents the sum of the sample characterization values contained within the corresponding representation slice 956. This is not required, however, and it additionally is within the scope of the present disclosure that each projected sample characterization value 960 can be based upon the associated sample characterization values in any suitable manner. As examples, transforming the subset of sample characterization values into the projected sample characterization value corresponding to a given representation slice 956 may include calculating an average sample characterization value within the representation slice, calculating a maximum sample characterization value within the representation slide, and/or calculating a distribution of sample characterization values within the representation slice.

For simplicity, FIG. 9A illustrates the planar representation 950 as being rotated by the sample tilt angle 944 relative to a series of vertical columns representing the representation slices 956. In practice, the transformations visually depicted in FIG. 9A may be accomplished in any of a variety of manners. For example, the planar representation 950 may represent a two-dimensional data structure (e.g., a matrix) representing the sample characterization values subsequent to applying a rotational transformation to the data structure. Such a rotational transformation may, for example, map each sample characterization value onto a coordinate in a base coordinate system corresponding to the horizontal and vertical directions in FIG. 9A. In such an example, each representation slice 956 may represent an interval of coordinate values along one such dimension (e.g., the horizontal dimension of FIG. 9A) such that the corresponding projected sample characterization value 960 represents the sum of the sample characterization values found within such an interval.

In other examples, transforming the planar representation into projected sample characterization values may not include transforming the planar representation itself, but instead may include projecting the sample characterization values along axes that are angled relative to the base dimensions of the planar representation. In such examples, each such projection axis may represent a corresponding processing axis. In all examples, regardless of the manner in which the planar representation is transformed to produce the set of projected sample characterization values, the projecting the sample characterization values may be described as projecting along an axis of (e.g., a direction relative to) the planar representation.

In all examples, transforming the planar representation into the set of projected sample characterization values may include performing any suitable averaging, anti-aliasing, binning, and/or or other steps known to the art of data processing to address and/or mitigate artifacts associated with rotational transformations.

Each representation slice 956 may have any suitable width, such as may be determined and/or measured relative to a width of the rotated planar representation 950 and/or relative to the representation locations 952 thereof. For example, considering for simplicity a case in which the sample tilt angle 944 is zero, each representation slice 956 can correspond to a single column of representation locations 952, or can correspond to a plurality of columns of representation locations 952.

FIG. 9A illustrates the set of projected sample characterization values 960 as a series of values P1, . . . , P10 associated with corresponding representation slices 956. Similarly, FIG. 9B illustrates another set of projected sample characterization values 960 as a graphical plot of the projected sample characterization values 960, with the horizontal axis identifying an index of the corresponding representation slice 956.

Figure 9B:
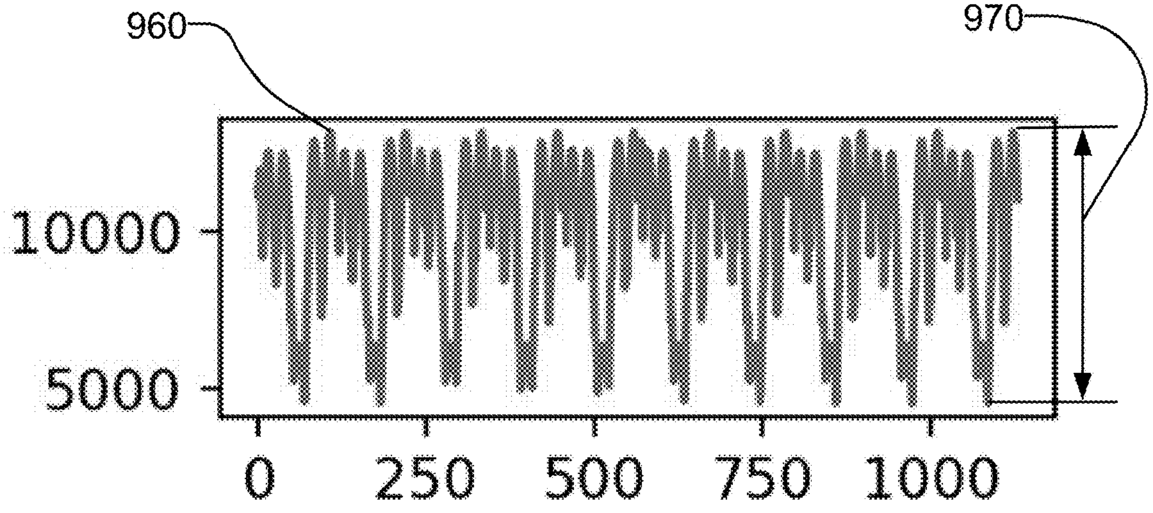
FIG. 9B illustrates a set of projected sample characterization values according to an example.

FIG. 9B also illustrates a manner in which the set of projected sample characterization values 960 can produce a corresponding uniformity metric 970 representing the processing axis. Specifically, in the examples disclosed herein, the uniformity metric 970 is determined as the difference between the maximum and minimum values exhibited in the set of projected sample characterization values 960. In other examples, other statistical properties of the set of projected sample characterization values 960 may be used as, or in the calculation of, the uniformity metric 970. Examples of such statistical properties include an average value of the set of projected sample characterization values 960, a maximum value of the set of projected sample characterization values 960, a minimum value of the set of projected sample characterization values, and/or a standard deviation of the set of projected sample characterization values 960.

In some examples, the set of projected sample characterization values may be truncated and/or otherwise revised such that the uniformity metric is determined based on a subset of the full set of projected sample characterization values. For example, with reference to FIG. 9A, it may be seen that the projected sample characterization values P1, P2, P9, and P10 each represent the sum of fewer sample characterization values than each of the projected sample characterization values P3-P8. Accordingly, it may be assumed that P1, P2, P9, and P10 represent outliers to the statistical trends exhibited by the remaining projected sample characterization values. In this example, truncating the set of projected sample characterization values may include removing P1, P2, P9, and P10 from the set of projected sample characterization values prior to transforming the set of projected sample characterization values into the uniformity metric.

Additionally or alternatively, in some examples, the projecting the sample characterization values at 730 can include defining the representation slices 956 such that each representation slice encompasses the same number of sample characterization values. For example, with reference to FIG. 9A, the outlier effect described above may be associated with the fact that the rotated planar representation 950 is inscribed within the dashed rectangle formed by the plurality of representation slices 956. As a result, and as shown in FIG. 9A, representation slices 956 on the edges may contain and/or represent smaller proportions of the planar representation 950.

Alternatively, forming the plurality of representation slices such that the plurality of representation slices are inscribed within the rotated planar representation 950 can result in each representation slice containing the same, or approximately the same, number of sample characterization values. Accordingly, defining the representation slices in this manner may allow for producing a set of projected sample characterization values that need not be truncated prior to analysis. Because varying proportions of the total planar representation 950 are excluded from the total area of the representation slices in this example (based on the sample tilt angle), such a method further may include scaling the projected sample characterization values by a factor that depends on the sample tilt angle to normalize these values across sample tilt angles.

In some examples, a graphical plot of projected sample characterization values 960 such as that shown in FIG. 9B may be understood and/or interpreted as representing a physical characteristic of a sample specimen that is milled by an ion beam along the corresponding processing axis. For example, in an example in which the sample characterization values represent material densities and/or another material property related to a milling rate, each projected sample characterization value may be interpreted as representing a total mass, or total resistance to milling, that will be encountered by an ion beam at an x-position (following the coordinate systems of FIGS. 3 and 5) corresponding to the corresponding representation slice 956.

In this manner, one or more statistics representing the set of projected sample characterization values for a given processing axis may in turn be interpreted as representing similar statistics of an expected physical characteristic of the sample specimen when milled along such a processing axis. For example, when the uniformity metric 970 is measured as the difference between the maximum and minimum values exhibited in the set of projected sample characterization values 960, the uniformity metric 970 may represent an expected maximum thickness, or variation in thicknesses, of the sample specimen upon milling the sample specimen along the corresponding processing axis.

Figure 10B:
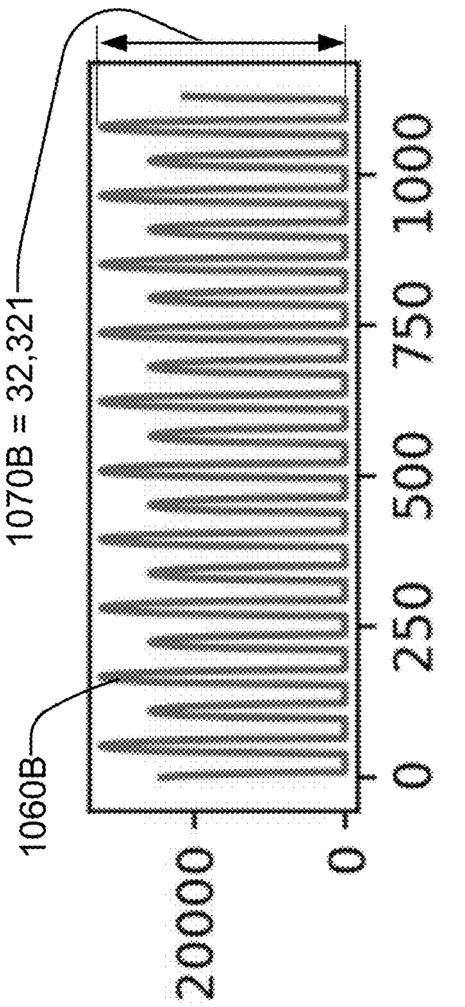
FIG. 10B illustrates a set of projected sample characterization values corresponding to the planar representation of FIG. 10A.
Figure 10D:
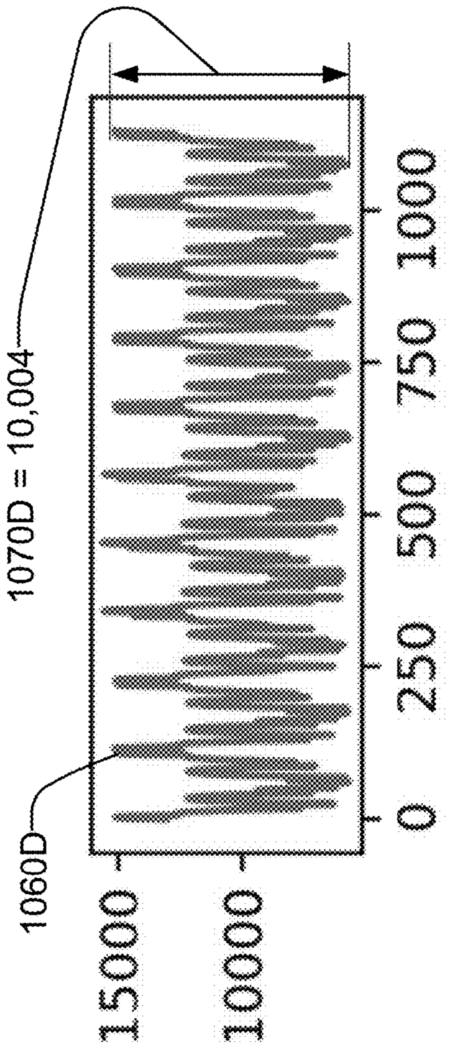
FIG. 10D illustrates a set of projected sample characterization values corresponding to the planar representation of FIG. 10C.
Figure 10A:
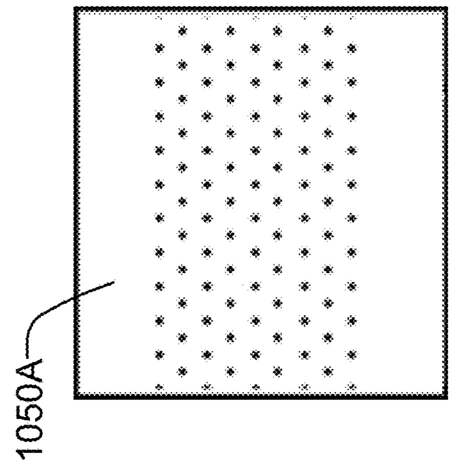
FIG. 10A is a visual depiction of a planar representation of a sample specimen in a default orientation according to an example.

FIGS. 10A-10D illustrate a manner in which rotation of the planar representation of the sample specimen can yield varying sets of projected sample characterization values. In particular, FIG. 10A illustrates a planar representation 1050A of a sample specimen in a default orientation corresponding to a default processing axis, while FIG. 10B illustrates the resulting set of projected sample characterization values 1060B. For clarity, FIG. 10A illustrates the planar representation 1050A as a visual representation in which the sample characterization values are represented as grayscale vales.

Figure 10C:
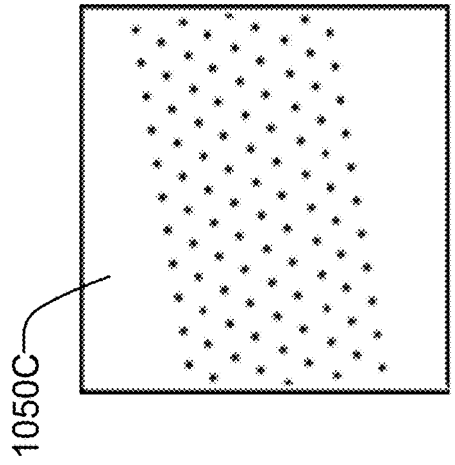
FIG. 10C is a visual depiction of a planar representation of a sample specimen that is rotated relative to the default orientation of FIG. 10A according to an example.

By contrast, FIG. 10C illustrates a rotated planar representation 1050C, which represents the planar representation 1150A rotated relative to the default orientation by a sample tilt angle of 9°, with FIG. 10D illustrating the set of projected sample characterization values 1060D corresponding to this processing axis. FIGS. 10B and 10D additionally label the respective uniformity metrics 1070B and 1070D corresponding to each processing axis. As may be seen comparing FIGS. 10B and 10D, using a processing axis that is rotated by 9° relative to the default orientation desirably yields a considerably smaller uniformity metric 1070D.

In order to identify the preferred processing axis, the method 700 can include producing a set of uniformity metrics by repeating the producing the set of projected sample characterization values and the determining the corresponding uniformity metric for each of a plurality of processing axes. For example, FIG. 10E represents the set of uniformity metrics 1070 corresponding to rotating the planar representation 1050A of FIG. 10A by sample tilt angles 1044 in the range ±10°, each separated by an interval of 0.25°.

As discussed above, when calculated as a difference between maximum and minimum projected sample characterization values, the uniformity metric may be understood as representing an expected thickness (or variability of thickness) of the sample specimen upon milling along the corresponding processing axis. Thus, in some examples, the preferred processing axis may be selected as that which corresponds to a minimum value of the set of uniformity metrics. In the example of FIG. 10E, it may be seen that the minimum value of the set of uniformity metrics 1070 corresponds to a preferred sample tilt angle 1046 of approximately 4.5°.

Figure 10E:
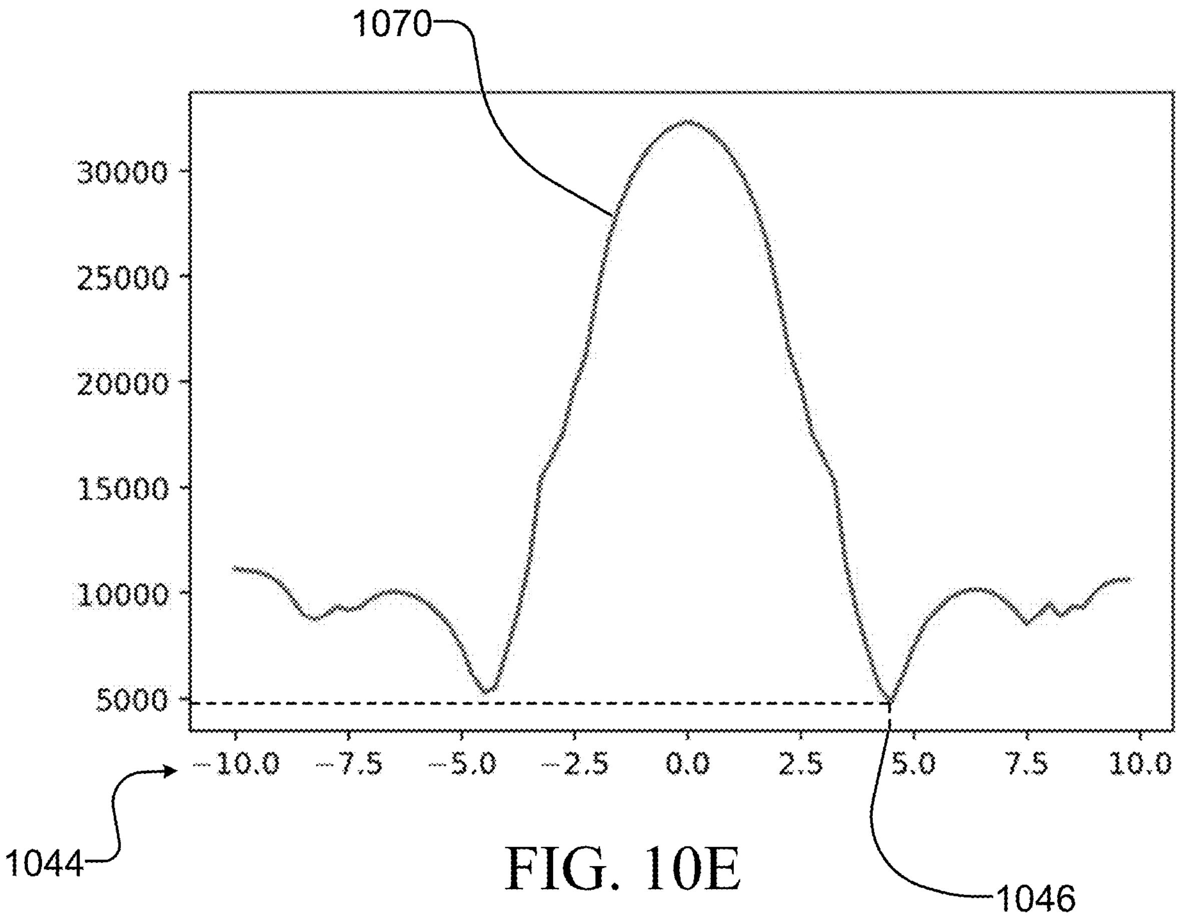
FIG. 10E illustrates a set of uniformity metrics corresponding to the examples of FIGS. 10A-10D.

In the example of FIGS. 10A-10E, and as seen in FIG. 10E, the set of uniformity metrics 1070D associated with the planar representation 1050A (and/or with rotations thereof) may be described as being generally symmetric with respect to the sample tilt angle 1044. Such a property may be associated with a corresponding symmetry of the planar representation. For example, because a version of the planar representation 1050A that is tilted by a sample tilt angle (e.g., as represented by the planar representation 1050C) is substantially mirror-symmetric with a version that is tilted in the opposite direction by the same degree, the projected sample characterization values associated with a given sample tilt angle in this example are substantially identical to those associated with the inverse sample tilt angle.

Figures 11A, 11B, 11C, 11D, 11E, 11F:
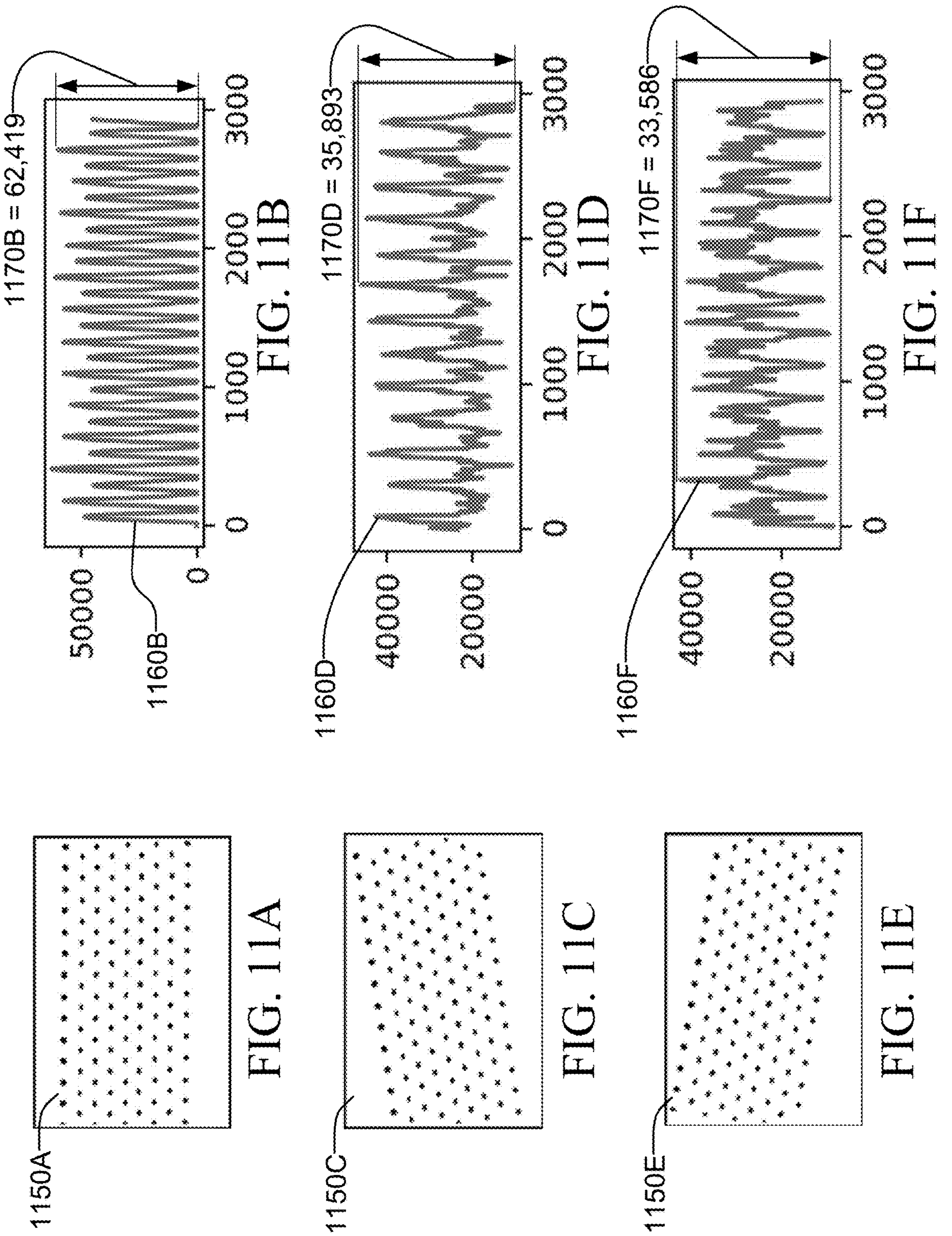
FIG. 11A is a visual depiction of a planar representation of a sample specimen in a default orientation according to an example.
FIG. 11B illustrates a set of projected sample characterization values corresponding to the planar representation of FIG. 11A.
FIG. 11C is a visual depiction of a planar representation of a sample specimen that is rotated relative to the default orientation of FIG. 11A in a first direction according to an example.
FIG. 11D illustrates a set of projected sample characterization values corresponding to the planar representation of FIG. 11C.
FIG. 11E is a visual depiction of a planar representation of a sample specimen that is rotated in a second direction relative to the default orientation of FIG. 11A according to an example.
FIG. 11F illustrates a set of projected sample characterization values corresponding to the planar representation of FIG. 11E.

In other examples, however, the planar representation may have a characteristic such that the associated uniformity metrics are asymmetric with respect to the sample tilt angle. As an example, FIG. 11A illustrates an example of a planar representation 1150A in which the depicted features are non-uniform in shape and size, while FIG. 11B illustrates a set of projected sample characterization values 1160B associated with the default orientation of FIG. 11A. FIG. 11C illustrates a rotated planar representation 1150C representing the planar representation 1150A rotated by 9°, while FIG. 11E illustrates a rotated planar representation 1150E representing the planar representation 1150A rotated by −9° (that is, by 9° in a direction opposite to that of FIG. 11C). FIGS. 11D and 11F illustrate the sets of projected sample characterization values 1160D and 1160F corresponding to the orientations of FIGS. 11C and 11E, respectively. Comparing FIGS. 11D and 11F, it may be seen that the uniformity metrics 1170D/1170F are asymmetric with respect to the sample tilt angle, with the projected sample characterization value sets 1160D/1160F being visually distinct in character from one another.

Figure 11G:
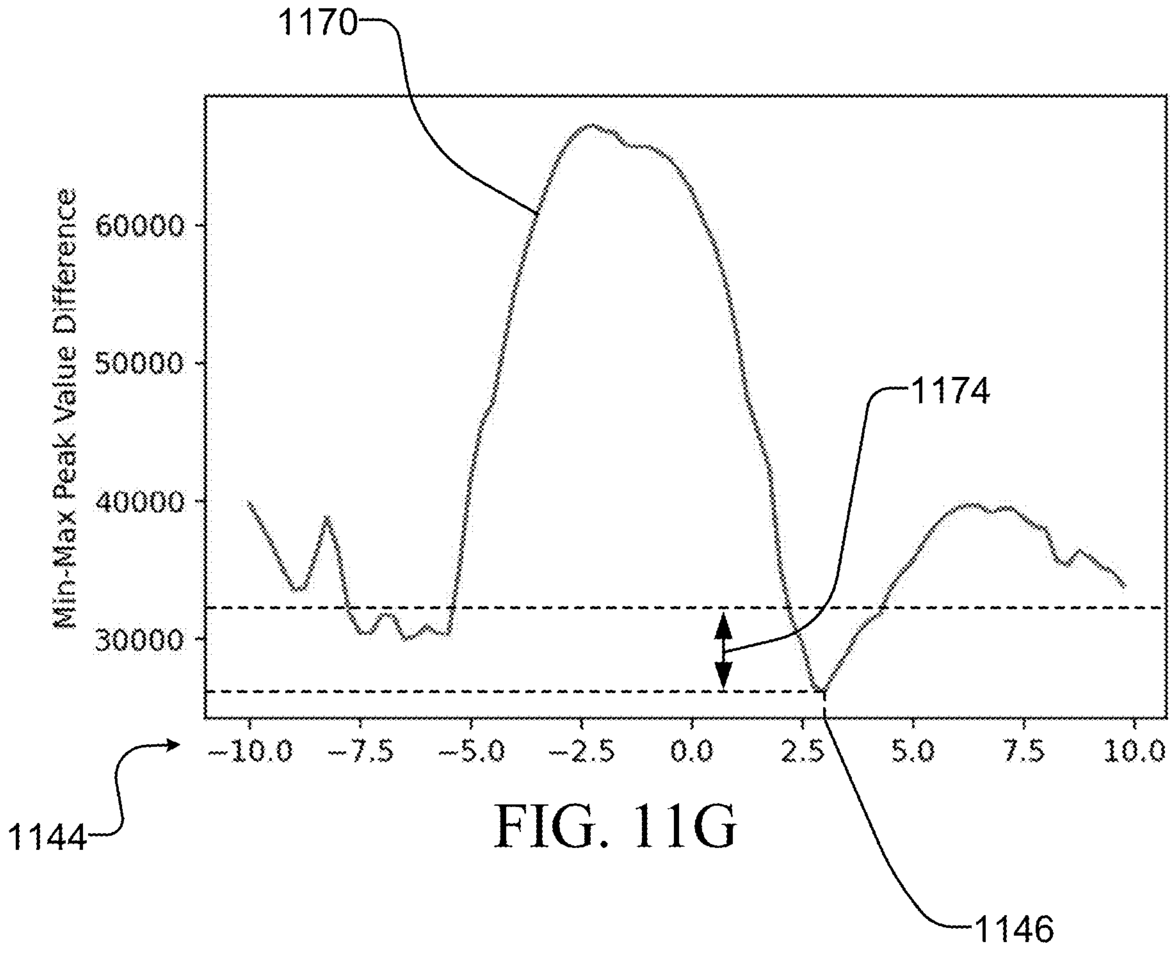
FIG. 11G illustrates a set of uniformity metrics corresponding to the examples of FIGS. 11A-11F.

Such asymmetry is further illustrated in FIG. 11G, which represents the set of uniformity metrics 1170 corresponding to rotating the planar representation 1150A of FIG. 11A by sample tilt angles 1144 in the range ±10°. In the example of FIG. 11G, it may be seen that the minimum value of the set of uniformity metrics 1170 corresponds to a preferred sample tilt angle 1146 of approximately +3°, corresponding to a uniformity metric 1170 that is significantly smaller than that associated with a sample tilt angle of −3°.

In the examples of FIGS. 10E and 11G, identification of the preferred sample tilt angles 1046/1146 corresponds to identifying the sample tilt angle 1044/1144 that minimizes the uniformity metric 1070/1170. In other examples, the preferred sample tilt angle may correspond to a sample tilt angle other than that at which the uniformity metric is minimized. For example, while a preferred sample tilt angle may correspond to a relatively small value of the uniformity metric, there may exist a range of uniformity metrics close to the minimum uniformity metric in which other considerations may be used to determine a preferred sample tilt angle.

As a more specific example, and as illustrated in FIG. 11G, the identifying the preferred processing axis at 740 may include identifying a subset of the uniformity metrics 1170 that fall within a preferred range 1174 of uniformity metrics. In such examples, the preferred processing axis may be identified such that the uniformity metric 1170 corresponding to the preferred processing axis is within the preferred range 1174 of uniformity metric values.

In such examples, the preferred range of uniformity metric values may be determined at least partially based upon the minimum value of the uniformity metric. For example, the preferred range of uniformity metric values may include a range of uniformity metric values within a threshold percent of the minimum uniformity metric. In such examples, the threshold percent can assume any of a variety of values, examples of which include at least 1%, at least 5%, at least 10%, at least 20%, at most 25%, at most 15%, at most 7%, and/or at most 2%.

In an example in which the preferred sample tilt axis is determined at least partially based on a consideration other than strictly minimizing the uniformity metric, any suitable quantities may be used in such a determination. Such additional considerations may be based, for example, on other properties of the set of projected sample characterization values associated with each sample tilt angle. In particular, in some examples, the producing the set of uniformity metrics at 750 can include, for each processing axis, transforming the set of projected sample characterization values into a secondary uniformity metric. The identifying the preferred processing axis at 740 thus may be at least partially based on the secondary uniformity metric. As examples, the secondary uniformity metric may represent an average projected sample characterization value of the set of projected sample characterization values, a maximum projected sample characterization value of the set of projected sample characterization values, a minimum projected sample characterization value of the set of projected sample characterization values, a standard deviation of the set of projected sample characterization values, etc.

In some examples, identifying the preferred processing axis thus can include producing the set of uniformity metrics to identify a minimum uniformity metric, determining a preferred subset of the uniformity metrics falling within a preferred range of the uniformity metric, and determining a preferred subset of the processing axes corresponding to the preferred subset of uniformity metrics. Such a method then may include identifying a processing axis among the preferred subset of processing axes corresponding to a secondary uniformity metric that is maximized, minimized, and/or otherwise preferred among the secondary uniformity metrics corresponding to processing axes in the preferred range of processing axes. Any aspects of the methods disclosed herein can be performed at least partially, or fully, automatically by the controller and/or without human intervention. For example, when performed in conjunction with the CPM system 210 of FIG. 2, the methods disclosed herein may allow for the analysis and milling of the sample specimen with the FIB system 211 along the preferred processing axis subsequent to extracting the sample specimen from the bulk sample 222 without removing the sample specimen from the lower chamber 226 and/or without breaking a vacuum formed in the lower chamber 226. Accordingly, the methods disclosed herein can be performed during runtime to mill the sample specimen along the preferred processing axis that is specifically determined for the sample specimen without requiring human analysis of and/or manipulation of the sample specimen, thus improving lamella quality while reducing system downtime.

Any of the methods disclosed herein with reference to any of FIGS. 7-11G also may be described as including any of the method steps disclosed herein with reference to FIGS. 1-2. For example, the method 700 of FIG. 7 also may include the steps of positioning a bulk sample (e.g., the bulk sample 222) on a stage (e.g., the bulk sample stage 225), extracting the sample specimen from the bulk sample, transferring the sample specimen to a sample holder (e.g., the sample holder 224), and/or rotating the sample with the sample holder and/or the stage by a sample tilt angle corresponding to the preferred processing axis. In an example in which the method 700 includes the processing the sample specimen at 780 to produce a lamella, the method 700 further may include analyzing the lamella with a TEM (e.g., the SEM 241 operating in a TEM mode).

Figure 12:
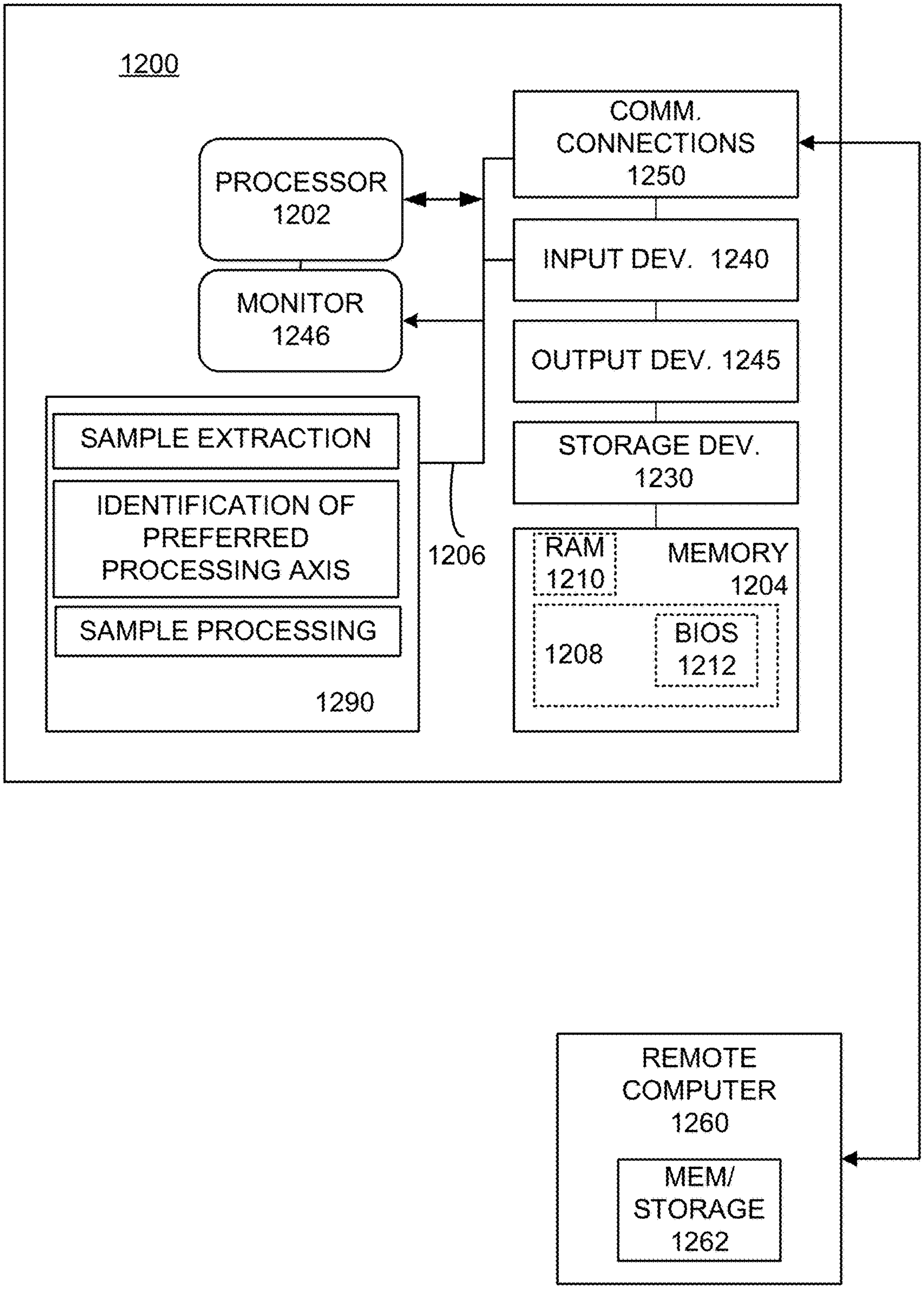
FIG. 12 is a schematic representation of a computing system that may be used to perform one or more methods of the present disclosure according to an example.

FIG. 12 and the following discussion are intended to provide a brief, general description of an exemplary computing environment in which the disclosed technology may be implemented. In particular, some or all portions of this computing environment can be used with the above methods and apparatus to, for example, produce projected sample characterization values, produce planar representations, produce and/or process sample images, identify preferred processing axes, and/or perform any portions of the methods disclosed above.

Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, tablets, multiprocessor systems, microprocessor-based or programmable consumer electronics, network PCs, minicomputers, mainframe computers, virtual machines, containerized applications, Kubernetes clusters, and the like. The disclosed technology also may be practiced in distributed computing environments where tasks are performed by remote processing devices that are linked through a communications network. In a distributed computing environment, program modules may be located in both local and remote memory storage devices. In some cases, such processing is provided in a CPM system. The disclosed systems can serve to control image acquisition and provide a user interface as well as serve as an image processor.

With reference to FIG. 12, an exemplary system for implementing the disclosed technology includes a general-purpose computing device in the form of an exemplary conventional PC 1200, including one or more processing units 1202, a system memory 1204, and a system bus 1206 that couples various system components including the system memory 1204 to the one or more processing units 1202. The system bus 1206 may be any of several types of bus structures including a memory bus or memory controller, a peripheral bus, and a local bus using any of a variety of bus architectures. The exemplary system memory 1204 includes read-only memory (ROM) 1208 and random-access memory (RAM) 1210. A basic input/output system (BIOS) 1212, containing the basic routines that help with the transfer of information between elements within the PC 1200, is stored in ROM 1208.

The exemplary PC 1200 further includes one or more storage devices 1230 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1206 by a hard disk drive interface, a magnetic disk drive interface, and an optical drive interface, respectively. The drives and their associated computer readable media provide nonvolatile storage of computer-readable instructions, data structures, program modules, and other data for the PC 1200. Other types of computer-readable media which can store data that is accessible by a PC, such as magnetic cassettes, flash memory cards, solid-state drives, digital video disks, CDs, DVDs, RAMs, ROMs, and the like, may also be used in the exemplary operating environment.

A number of program modules may be stored in the storage devices 1230 including an operating system, multiple operating systems, virtual operating systems, one or more application programs, other program modules, and/or program data. In some examples, one or more aspects of the methods disclosed herein may be programmed, implemented, encoded, trained, and/or otherwise transferred to the program modules via machine learning, neural networks, artificial intelligence, etc.

The exemplary PC 1200 can include various devices configured for user interface. For example, a user may enter commands and information into the PC 1200 through one or more input devices 1240 such as a keyboard and/or a pointing device such as a mouse. For example, the user may enter commands to initiate image acquisition and/or to initiate one or more methods disclosed herein. Other input devices may include a digital camera, microphone, joystick, game pad, buttons, dials, satellite dish, scanner, or the like. In some examples, several such input devices can be integrated into a single user interface device, such as may be commonly used in conjunction with a CPM system. These and other input devices are often connected to the one or more processing units 1202 through a serial port interface that is coupled to the system bus 1206, but may be connected by other interfaces such as a parallel port, game port, universal serial bus (USB), or wired or wireless network connection. A monitor 1246 or other type of display device is also connected to the system bus 1206 via an interface, such as a video adapter, and can display, for example, one or more images of a sample or specimen prior to, subsequent to, and/or during performance of one or more methods disclosed herein. The monitor 1246 can also be used to select sections for processing or particular image alignment and alignment procedures such as correlation, feature identification, and preview area selection or other image selection. Other peripheral output devices, such as speakers and printers (not shown), may be included.

The PC 1200 may operate in a networked environment using logical connections to one or more remote computers, such as a remote computer 1260. In some examples, one or more network or communication connections 1250 are included. The remote computer 1260 may be another PC, a server, a router, a network PC, and/or a peer device or other common network node, and typically includes many or all of the elements described above relative to the PC 1200, although only a memory storage device 1262 has been illustrated in FIG. 12. The personal computer 1200 and/or the remote computer 1260 can be connected to a local area network (LAN) and/or a wide area network (WAN). Such networking environments are commonplace in offices, enterprise wide computer networks, intranets, and the Internet.

As shown in FIG. 12, a memory 1290 (or portions of this or other memory) can store processor-executable instructions for sample extraction, for identification of a preferred processing axis, and/or for processing the sample. For example, such processor-executable instructions can, when executed by a processor system, cause the PC 1200 and/or another component (e.g., any suitable components of the CPM system 100 of FIG. 1 and/or the CPM system 210 of FIG. 2) to execute any of the methods disclosed herein. In addition, the memory 1290 can include processor-executable instructions for setting cross-correlations, image alignment such as image rotation and translation, selection of reference images and ROIs, and/or recording stage coordinates for alignment. In some examples, processor-executable instructions can produce displayed images showing section identification, processing of preview images, and/or acquisition of additional images.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

Unless otherwise stated, as used herein, the term "substantially" means the listed value and/or property and any value and/or property that is at least 75% of the listed value and/or property. Equivalently, the term "substantially" means the listed value and/or property and any value and/or property that differs from the listed value and/or property by at most 25%. For example, "substantially equal" refers to quantities that are fully equal, as well as to quantities that differ from one another by up to 25%.

The systems, apparatus, and methods described herein should not be construed as limiting in any way. Instead, the present disclosure is directed toward all novel and non-obvious features and aspects of the various disclosed examples, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, and the like may be characterized by qualifying terms such as "lowest," "best," "minimum," "extreme," etc. It is to be understood that such descriptions are intended to indicate that a selection among many used functional alternatives can be made, and such selections need not be better, smaller, or otherwise preferable to other selections.

As used herein, the term "image" may refer to a displayed view of a specimen (e.g., as presented on a display device) and/or to stored data that can be used to produce displayed images. Examples of such store data include such as digital data stored in non-transitory computer readable media as, for example, JPG, TIFF, BMP or other formats.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various examples. Computer-executable instructions for program modules may be executed within a local or distributed computing system. In general, a computing system or computing device can be local or distributed, and can include any combination of special-purpose hardware and/or general-purpose hardware with software implementing the functionality described herein, examples of which include personal computers, hand-held devices, tablets, multiprocessor systems, microprocessor-based or programmable consumer electronics, network PCs, minicomputers, mainframe computers, virtual machines, containerized applications, Kubernetes clusters, etc.

In various examples described herein, a module (e.g., component or engine) can be "programmed" and/or "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

Described algorithms may be, for example, embodied as software or firmware instructions carried out by a digital computer. For instance, any of the disclosed methods can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid-state drives (e.g., Flash drives)). The one or more processors can execute computer-executable instructions stored on one or more of the tangible, non-transitory computer-readable media, and thereby perform any of the disclosed techniques. For instance, software for performing any of the disclosed examples can be stored on the one or more volatile, non-transitory computer-readable media as computer-executable instructions, which when executed by the one or more processors, cause the one or more processors to perform any of the disclosed techniques or subsets of techniques.

Having described and illustrated the principles of the disclosed technology with reference to the illustrated examples, it will be recognized that the illustrated examples can be modified in arrangement and detail without departing from such principles. For instance, elements of examples performed in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

ADDITIONAL EXAMPLES OF THE DISCLOSED TECHNOLOGY

In view of the above-described implementations of the disclosed subject matter, this application discloses the additional examples enumerated below. It should be noted that one feature of an example in isolation or more than one feature of the example taken in combination with and. optionally, in combination with one or more feature of one or more further examples are further examples also falling within the disclosure of this application.

Example 1. A method comprising: producing, with a controller, a set of projected sample characterization values associated with each of a plurality of processing axes; and identifying, with the controller, a preferred processing axis based on the projected sample characterization values.

Example 2. The method of example 1, wherein the producing the set of projected sample characterization values comprises, for each processing axis of the plurality of processing axes: producing a planar representation of a sample specimen, wherein the planar representation comprises sample characterization values mapped onto a two-dimensional array of representation locations corresponding to respective portions of the sample specimen; and projecting the sample characterization values along an axis of the planar representation corresponding to the processing axis.

Example 3. The method of example 2, wherein the producing the set of projected sample characterization values comprises producing such that the set of projected sample characterization values has a reduced dimensionality relative to the planar representation of the sample specimen.

Example 4. The method of any example herein, particularly any one of examples 2-3, wherein the sample specimen comprises one or more high-aspect-ratio features that extend through the sample specimen along a feature axis, and wherein the planar representation represents the sample specimen as viewed in a plane at least substantially perpendicular to the feature axis.

Example 5. The method of any example herein, particularly any one of examples 2-4, wherein each sample characterization value is a scalar quantity.

Example 6. The method of any example herein, particularly any one of examples 2-4, wherein each sample characterization value comprises a multi-dimensional quantity.

Example 7. The method of any example herein, particularly any one of examples 2-6, wherein each sample characterization value comprises a numerical quantity characterizing a material property associated with the corresponding representation location.

Example 8. The method of example 7, wherein the material property comprises a density of the sample specimen at a location corresponding to the representation location.

Example 9. The method of any example herein, particularly any one of examples 7-8, wherein the material property comprises a relative rate at which a portion of the sample specimen corresponding to the representation location will be milled by an ion beam.

Example 10. The method of any example herein, particularly any one of examples 2-9, wherein the producing the planar representation of the sample specimen is performed, at least in part, by the controller.

Example 11. The method of any example herein, particularly any one of examples 2-10, wherein the projecting the sample characterization values along the axis of the planar representation comprises one or both of: (i) applying a rotational transformation to the planar representation by an angle corresponding to the processing axis; and (ii) projecting the sample characterization values along a direction that is angled relative to the planar representation by an angle corresponding to the processing axis.

Example 12. The method of any example herein, particularly any one of examples 2-11, wherein the producing the planar representation of the sample specimen comprises: producing a sample image of the sample specimen; and processing, with the controller, the sample image of the sample specimen to generate the planar representation of the sample specimen.

Example 13. The method of example 12, wherein the representation locations correspond to respective portions of the sample image.

Example 14. The method of any example herein, particularly any one of examples 12-13, wherein the producing the sample image comprises capturing a micrograph image of the sample specimen.

Example 15. The method of any example herein, particularly any one of examples 12-14, wherein the sample specimen comprises an exposed surface, and wherein the producing the sample image comprises imaging the exposed surface.

Example 16. The method of example 15, wherein the exposed surface extends at least substantially in a surface plane, and wherein the imaging the exposed surface comprises imaging such that a plane of the sample image corresponds to the surface plane.

Example 17. The method of any example herein, particularly any one of examples 12-16, wherein the producing the sample image comprises retrieving, with the controller, a previously captured image of the sample specimen.

Example 18. The method of any example herein, particularly any one of examples 12-17, wherein the processing the sample image comprises mapping the sample characterization values onto the two-dimensional array of representation locations based, at least in part, on the sample image.

Example 19. The method of example 18, wherein the sample image comprises a plurality of image regions, each image region comprising a corresponding one or more image pixels with respective image intensity values, wherein each representation location represents a respective image region, and wherein the mapping the sample characterization values onto the two-dimensional array of representation locations comprises assigning a respective sample characterization value to each representation location based, at least in part, on the image intensity values of the one or more image pixels of the respective image region.

Example 20. The method of example 19, wherein the image intensity values comprise grayscale values.

Example 21. The method of any example herein, particularly any one of examples 19-20, wherein the mapping the sample characterization values onto the two-dimensional array of representation locations is performed such that each sample characterization value corresponds to the image intensity values of the one or more image pixels of the respective image region according to a predetermined transfer function.

Example 22. The method of any example herein, particularly any one of examples 19-21, wherein the processing the sample image comprises applying a threshold filter to the sample image to reassign the respective image intensity values of one or more pixels with image intensity values above or below a threshold value.

Example 23. The method of any example herein, particularly any one of examples 19-22, wherein the mapping the sample characterization values onto the two-dimensional array of representation locations is performed based, at least in part, on one or more known material properties of the sample specimen.

Example 24. The method of any example herein, particularly any one of examples 12-23, wherein the processing the sample image comprises masking the sample image to isolate one or more features of the sample image.

Example 25. The method of any example herein, particularly any one of examples 2-24, wherein the producing the planar representation of the sample specimen comprises: determining a sample material property corresponding to each representation location; and assigning the sample characterization values to the representation locations based, at least in part, on the sample material property.

Example 26. The method of example 25, wherein the determining the sample material property comprises determining based, at least in part, on a known material composition of the sample specimen.

Example 27. The method of any example herein, particularly any one of examples 25-26, wherein the determining the sample material property comprises determining based, at least in part, on one or more features of a sample image of the sample specimen.

Example 28. The method of any example herein, particularly any one of examples 1-27, wherein the sample specimen comprises structural features arranged to produce a periodically repeating material characteristic in the sample specimen, and wherein the identifying the preferred processing axis comprises identifying such that the structural features are at least partially misaligned with one another as viewed along the preferred processing axis.

Example 29. The method of any example herein, particularly any one of examples 1-28, wherein the identifying the preferred processing axis comprises: producing, with the controller, a set of uniformity metrics corresponding to the plurality of processing axes, wherein each uniformity metric corresponds to the set of projected sample characterization values associated the corresponding processing axis; identifying, with the controller, a preferred uniformity metric of the set of uniformity metrics; and identifying, with the controller, the preferred processing axis as the processing axis corresponding to the preferred uniformity metric.

Example 30. The method of example 29, wherein each uniformity metric comprises a quantity with a reduced dimensionality relative to the set of projected sample characterization values associated with the corresponding processing axis.

Example 31. The method of any example herein, particularly any one of examples 29-30, wherein the producing the set of uniformity metrics comprises, for each processing axis of the plurality of processing axes: producing a planar representation of the sample specimen in an orientation corresponding to the processing axis, wherein the planar representation comprises sample characterization values mapped onto a two-dimensional array of representation locations corresponding to respective portions of the sample specimen; generating, based upon the planar representation and the processing axis, the set of projected sample characterization values; and transforming the set of projected sample characterization values into the uniformity metric.

Example 32. The method of example 31, wherein the producing the set of uniformity metrics further comprises, prior to the transforming the set of projected sample characterization values into the uniformity metric, truncating the set of projected sample characterization values.

Example 33. The method of any example herein, particularly any one of examples 31-32, wherein the producing the planar representation comprises: producing a default planar representation of a sample specimen in an orientation corresponding to a default processing axis; and rotating the default planar representation of the sample specimen by an angle corresponding to a difference between the processing axis and the default processing axis.

Example 34. The method of any example herein, particularly any one of examples 31-33, wherein the generating the set of projected sample characterization values comprises: partitioning the planar representation into a plurality of representation slices, each representation slice comprising a respective subset of sample characterization values; and for each representation slice, transforming the respective subset of sample characterization values corresponding to the representation slice into a corresponding projected sample characterization value of the set of projected sample characterization values.

Example 35. The method of example 34, wherein the transforming the respective subset of sample characterization values into the corresponding projected sample characterization value comprises summing the sample characterization values within each representation slice to produce the corresponding projected sample characterization value.

Example 36. The method of any example herein, particularly any one of examples 34-35, wherein the transforming the respective subset of sample characterization values into the corresponding projected sample characterization value comprises calculating one or more of: (i) an average sample characterization value within each representation slice; (ii) a maximum sample characterization value within each representation slice; and (iii) a distribution of sample characterization values within each representation slice.

Example 37. The method of any example herein, particularly any one of examples 31-36, wherein the transforming the set of projected sample characterization values into the uniformity metric comprises calculating one or more of: (i) an average projected sample characterization value of the set of projected sample characterization values; (ii) a maximum projected sample characterization value of the set of projected sample characterization values; (iii) a minimum projected sample characterization value of the set of projected sample characterization values; and (iv) a standard deviation of the set of projected sample characterization values.

Example 38. The method of any example herein, particularly any one of examples 31-37, wherein the transforming the set of projected sample characterization values into the uniformity metric comprises calculating the uniformity metric as the difference between a maximum projected sample characterization value and a minimum projected sample characterization value of the set of projected sample characterization values.

Example 39. The method of any example herein, particularly any one of examples 29-38, wherein the producing the set of uniformity metrics comprises individually determining the uniformity metric corresponding to each of the plurality of processing axes such that each processing axis is associated with a respective uniformity metric value.

Example 40. The method of any example herein, particularly any one of examples 29-39, wherein the producing the set of uniformity metrics comprises determining the uniformity metric at each of a plurality of processing axes in a test range of processing axes.

Example 41. The method of example 40, wherein the test range encompasses a range of processing axes from approximately −10 degrees to +10 degrees.

Example 42. The method of any example herein, particularly any one of examples 29-41, wherein the identifying the preferred processing axis comprises identifying such that the preferred processing axis corresponds to a minimum value of the uniformity metric in the set of uniformity metrics.

Example 43. The method of any example herein, particularly any one of examples 29-42, wherein the identifying the preferred processing axis comprises: identifying a subset of the set of uniformity metrics with uniformity metric values in a preferred range of uniformity metric values; and identifying the preferred processing axis such that the uniformity metric corresponding to the preferred processing axis is within the preferred range of uniformity metric values.

Example 44. The method of example 43, wherein the identifying the subset of the set of uniformity metrics comprises identifying such that each uniformity metric value in the preferred range of uniformity metric values is within a threshold percent of a minimum uniformity metric of the preferred range of uniformity metric values.

Example 45. The method of example 44, wherein the threshold percent is one or more of at least 1%, at least 5%, at least 10%, at least 20%, at most 25%, at most 15%, at most 7%, and at most 2%.

Example 46. The method of any example herein, particularly any one of examples 29-45, wherein the producing the set of uniformity metrics comprises, for each processing axis of the plurality of processing axes: producing a planar representation of the sample specimen in an orientation corresponding to the processing axis, wherein the planar representation comprises sample characterization values mapped onto a two-dimensional array of representation locations corresponding to respective portions of the sample specimen; generating, based upon the planar representation and the processing axis, a set of projected sample characterization values; and transforming the set of projected sample characterization values into a secondary uniformity metric, and wherein the identifying the preferred processing axis is based, at least in part, on the secondary uniformity metric.

Example 47. The method of example 46, wherein the secondary uniformity metric represents one or more of: (i) an average projected sample characterization value of the set of projected sample characterization values; (ii) a maximum projected sample characterization value of the set of projected sample characterization values; (iii) a minimum projected sample characterization value of the set of projected sample characterization values; and (iv) a standard deviation of the set of projected sample characterization values.

Example 48. A method comprising one or more of: extracting a sample specimen from a bulk sample positioned within a chamber of a charged particle microscope (CPM) system; imaging the sample specimen to produce a sample image representing a surface plane of the sample specimen; producing a set of projected sample characterization values associated with each of a plurality of sample tilt angles, each projected sample characterization value representing features of the sample image projected along a processing axis corresponding to the sample tilt angle; identifying a preferred sample tilt angle among the plurality of sample tilt angles; rotating the sample specimen to an orientation corresponding to the sample tilt angle; and processing, with a focused ion beam (FIB) system of the CPM system, the sample specimen to produce a lamella.

Example 49. The method of example 48, wherein the chamber is a sealed chamber, and wherein one or more of the extracting the sample specimen, the imaging the sample specimen, the identifying the preferred sample tilt angle, the rotating the sample specimen, and the processing the sample specimen is performed while the chamber remains sealed.

Example 50. The method of any example herein, particularly any one of examples 48-49, wherein the imaging the sample specimen comprises imaging with a scanning electron microscope (SEM) of the CPM system.

Example 51. The method of any example herein, particularly any one of examples 48-50, further comprising, subsequent to the processing the sample specimen to produce the lamella, performing transmission electron microscopy (TEM) analysis of the lamella.

Example 52. A computer-readable medium storing processor-executable instructions that, when executed by a processor system, cause the processor system to perform the method of any example herein, particularly any one of examples 1-51.

Example 53. A system comprising: a focused ion beam (FIB) system configured to direct and focus an ion beam toward a sample specimen along a processing axis; a sample holder configured to support the sample specimen relative to the ion beam; a stage configured to rotate the sample specimen relative to the ion beam; and a controller comprising a processor system and a computer-readable medium storing processor-executable instructions that, when executed by the processor system, cause the processor system to perform the method of any one of examples 1-51.

Example 54. The system of example 53, further comprising a scanning electron microscope (SEM) configured to direct and focus an electron beam toward the sample specimen.

Example 55. The system of example 54, wherein the FIB system is configured to produce a lamella from the sample specimen, and wherein the SEM is configured to perform transmission electron microscopy (TEM) of the lamella.

The features described herein with regard to any example can be combined with other features described in any one or more of the other examples, unless otherwise stated. For example, any one or more of the steps and/or features of one method can be combined with any one or more steps and/or features of another method.

In view of the many possible ways in which the principles of the disclosure may be applied, it should be recognized that the illustrated configurations depict examples of the disclosed technology and should not be taken as limiting the scope of the disclosure nor the claims. Rather, the scope of the claimed subject matter is defined by the following claims and their equivalents.

We claim:

1. A method comprising:

producing, with a controller, a set of projected sample characterization values associated with each of a plurality of processing axes associated with a sample specimen;

identifying, with the controller, a preferred processing axis based on the projected sample characterization values;

orienting, with a charged particle microscope (CPM) system, the sample specimen relative to an ion beam axis of a focused ion beam (FIB) system of the CPM system such that the ion beam approaches the sample specimen along the preferred processing axis; and processing, with the FIB system, the sample specimen along the preferred processing axis to produce a lamella.

2. The method of claim 1, wherein the producing the set of projected sample characterization values comprises, for each processing axis of the plurality of processing axes:

producing a planar representation of the sample specimen, wherein the planar representation comprises sample characterization values mapped onto a two-dimensional array of representation locations corresponding to respective portions of the sample specimen; and projecting the sample characterization values along an axis of the planar representation corresponding to the processing axis.

3. The method of claim 2, wherein each sample characterization value comprises a numerical quantity characterizing a material property associated with the corresponding representation location.

4. The method of claim 2, wherein the producing the planar representation of the sample specimen comprises:

determining a sample material property corresponding to each representation location; and assigning the sample characterization values to the representation locations based, at least in part, on the sample material property.

5. The method of claim 4, wherein the determining the sample material property comprises determining based, at least in part, on a known material composition of the sample specimen.

6. The method of claim 4, wherein the determining the sample material property comprises determining based, at least in part, on one or more features of a sample image of the sample specimen.

7. The method of claim 2, wherein the producing the planar representation of the sample specimen comprises:

producing a sample image of the sample specimen; and processing, with the controller, the sample image of the sample specimen to generate the planar representation of the sample specimen, wherein the processing the sample image comprises mapping the sample characterization values onto the two-dimensional array of representation locations based, at least in part, on the sample image.

8. The method of claim 7, wherein the producing the sample image comprises one or both of:

(i) capturing a micrograph image of the sample specimen; and (ii) retrieving, with the controller, a previously captured image of the sample specimen.

9. The method of claim 7, wherein the processing the sample image comprises applying a threshold filter to the sample image.

10. The method of claim 2, wherein the projecting the sample characterization values along the axis of the planar representation comprises one or both of:

(i) applying a rotational transformation to the planar representation by an angle corresponding to the processing axis; and (ii) projecting the sample characterization values along a direction that is angled relative to the planar representation by an angle corresponding to the processing axis.

11. The method of claim 1, wherein the identifying the preferred processing axis comprises:

producing, with the controller, a set of uniformity metrics corresponding to the plurality of processing axes, wherein each uniformity metric corresponds to the set of projected sample characterization values associated with the corresponding processing axis;

identifying, with the controller, a preferred uniformity metric of the set of uniformity metrics; and identifying, with the controller, the preferred processing axis as the processing axis corresponding to the preferred uniformity metric.

12. The method of claim 11, wherein the producing the set of uniformity metrics comprises, for each processing axis of the plurality of processing axes:

producing a planar representation of the sample specimen in an orientation corresponding to the processing axis, wherein the planar representation comprises sample characterization values mapped onto a two-dimensional array of representation locations corresponding to respective portions of the sample specimen;

generating, based upon the planar representation and the processing axis, the set of projected sample characterization values; and transforming the set of projected sample characterization values into the uniformity metric.

13. The method of claim 12, wherein the transforming the set of projected sample characterization values into the uniformity metric comprises calculating the uniformity metric as the difference between a maximum projected sample characterization value and a minimum projected sample characterization value of the set of projected sample characterization values.

14. The method of claim 12, wherein the producing the planar representation comprises:

producing a default planar representation of the sample specimen in an orientation corresponding to a default processing axis; and rotating the default planar representation of the sample specimen by an angle corresponding to a difference between the processing axis and the default processing axis.

15. The method of claim 11, wherein the identifying the preferred processing axis comprises identifying such that the preferred processing axis corresponds to a minimum value of the uniformity metric in the set of uniformity metrics.

16. A method comprising:

extracting a sample specimen from a bulk sample positioned within a chamber of a charged particle microscope (CPM) system;

imaging the sample specimen to produce a sample image representing a surface plane of the sample specimen;

producing a set of projected sample characterization values associated with each of a plurality of sample tilt angles, each projected sample characterization value representing features of the sample image projected along a processing axis corresponding to the sample tilt angle;

identifying a preferred sample tilt angle among the plurality of sample tilt angles;

rotating the sample specimen to an orientation corresponding to the preferred sample tilt angle; and processing, with a focused ion beam (FIB) system of the CPM system, the sample specimen to produce a lamella.

17. The method of claim 16, wherein the chamber is a sealed chamber, and wherein one or more of the extracting the sample specimen, the imaging the sample specimen, the identifying the preferred sample tilt angle, the rotating the sample specimen, and the processing the sample specimen is performed while the chamber remains sealed.

18. The method of claim 16, wherein the imaging the sample specimen comprises imaging with a scanning electron microscope (SEM) of the CPM system, and wherein the method further comprises, subsequent to the processing the sample specimen to produce the lamella, performing transmission electron microscopy (TEM) analysis of the lamella with the SEM.

19. A system comprising:

a focused ion beam (FIB) system configured to direct and focus an ion beam toward a sample specimen along an ion beam axis;

a stage configured to rotate the sample specimen relative to the ion beam; and a controller comprising a processor system and a computer-readable medium storing processor-executable instructions that, when executed by the processor system, cause the processor system to:

produce a set of projected sample characterization values associated with each of a plurality of processing axes, wherein the producing the set of projected sample characterization values comprises, for each processing axis of the plurality of processing axes:

producing a planar representation of a sample specimen, wherein the planar representation comprises sample characterization values mapped onto a two-dimensional array of representation locations corresponding to respective portions of the sample specimen; and projecting the sample characterization values along an axis of the planar representation corresponding to the processing axis;

identify a preferred processing axis based on the projected sample characterization values; and cause the stage to rotate the sample specimen relative to the ion beam axis such that the ion beam approaches the sample specimen along the preferred processing axis.

20. The system of claim 19, further comprising a scanning electron microscope (SEM) configured to direct and focus an electron beam toward the sample specimen to capture a micrograph image of the sample specimen, wherein the processor-executable instructions, when executed by the processor system, cause the processor system to produce the planar representation of the sample specimen based, at least in part, on the micrograph image, wherein the FIB system is configured to produce a lamella from the sample specimen, and wherein the SEM is configured to perform transmission electron microscopy (TEM) of the lamella.

* * * * *